United States Patent
Yang et al.

(10) Patent No.: US 12,362,012 B2
(45) Date of Patent: Jul. 15, 2025

(54) MIXED BITLINE LOCKOUT FOR QLC/TLC DIE

(71) Applicant: SanDisk Technologies LLC, Addison, TX (US)

(72) Inventors: Xiang Yang, Santa Clara, CA (US); Hua-Ling Cynthia Hsu, Fremont, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 202 days.

(21) Appl. No.: 17/895,304

(22) Filed: Aug. 25, 2022

(65) Prior Publication Data

US 2024/0071482 A1 Feb. 29, 2024

(51) Int. Cl.
| | | |
|---|---|---|
| *G11C 16/04* | (2006.01) | |
| *G11C 11/56* | (2006.01) | |
| *G11C 16/10* | (2006.01) | |
| *G11C 16/24* | (2006.01) | |
| *G11C 16/34* | (2006.01) | |

(52) U.S. Cl.
CPC ...... *G11C 11/5628* (2013.01); *G11C 11/5671* (2013.01); *G11C 16/0483* (2013.01); *G11C 16/10* (2013.01); *G11C 16/24* (2013.01); *G11C 16/3459* (2013.01)

(58) Field of Classification Search
CPC ............ G11C 11/5628; G11C 11/5671; G11C 16/0483; G11C 16/10; G11C 16/24; G11C 16/3459; G11C 2211/5621; G11C 2211/5642
USPC ...................................................... 365/185.03
See application file for complete search history.

(56) References Cited

U.S. PATENT DOCUMENTS

| | | |
|---|---|---|
| 8,531,889 B2 | 9/2013 | Mokhlesi |
| 8,971,141 B2 | 3/2015 | Mui et al. |
| 9,236,139 B1 | 1/2016 | Lai et al. |
| 9,437,302 B2 | 9/2016 | Tseng et al. |
| 9,514,836 B2 | 12/2016 | Iwai et al. |
| 9,570,159 B1 * | 2/2017 | Wakchaure ......... G11C 11/4096 |
| 11,309,032 B2 * | 4/2022 | Jang ..................... G06F 3/0679 |
| 2019/0267096 A1 | 8/2019 | Yang et al. |

* cited by examiner

*Primary Examiner* — Tha-O H Bui
(74) *Attorney, Agent, or Firm* — Pearl Cohen Zedek Latzer Baratz LLP

(57) ABSTRACT

Technology for mixed lockout verify. In a first programming phase, prior to a pre-determined data state completing verification, a no-lockout program verify is performed. After the pre-determined data state has completed verification, a lockout program verify is performed. The no-lockout verify may include charging all bit lines associated with the group to a sensing voltage to perform. The lockout verify may include selectively charging to the sensing voltage only bit lines associated with memory cells in the group to be verified. Bit lines associated with memory cells in the group that are not to be verified may be grounded to perform the lockout verify.

20 Claims, 22 Drawing Sheets

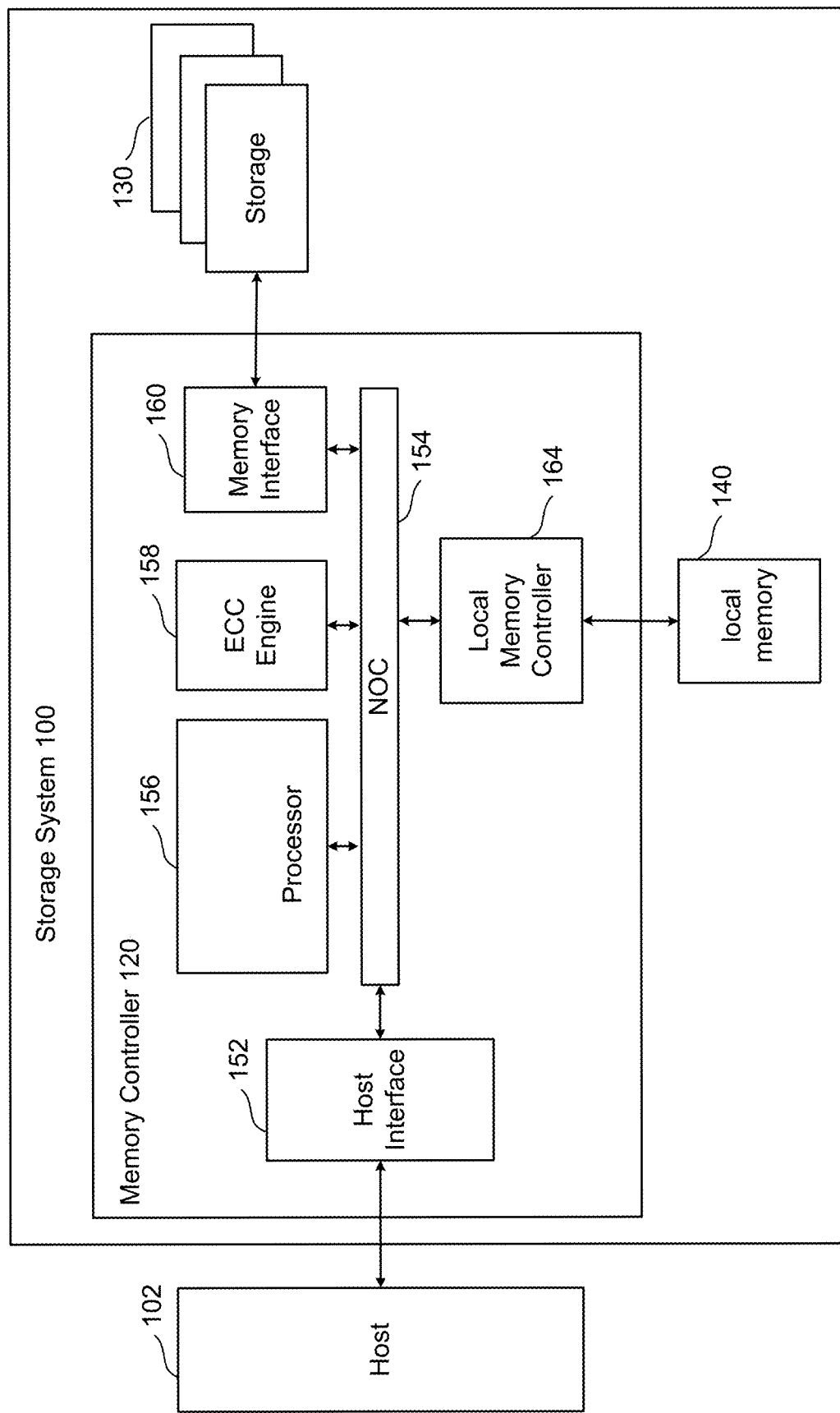

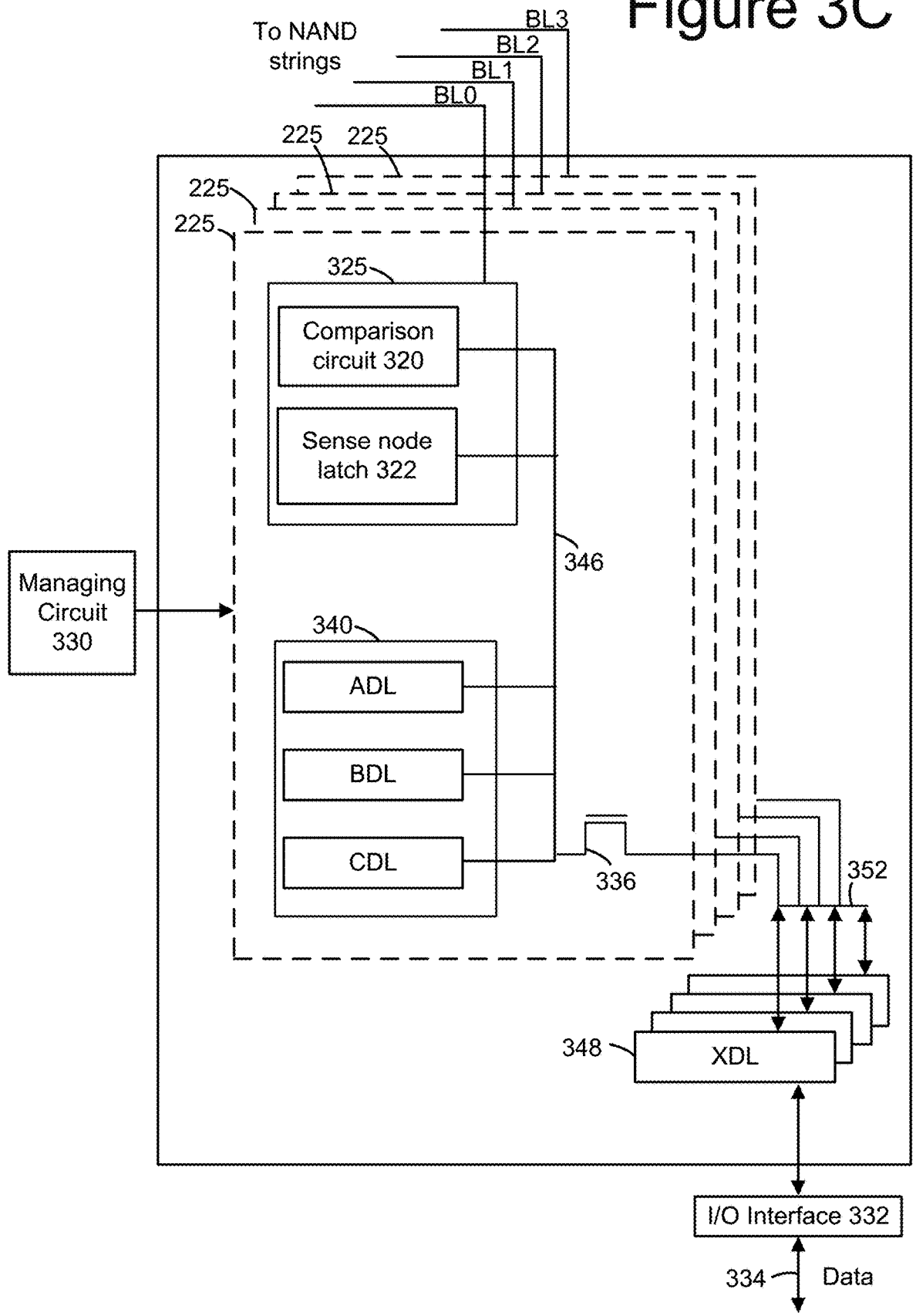

FIG. 9A1 (900a1)

| | S0 | S1 | S2 | S3 | S4 | S5 | S6 | S7 | S8 | S9 | S10 | S11 | S12 | S13 | S14 | S15 |
|---|---|---|---|---|---|---|---|---|---|---|---|---|---|---|---|---|
| TP | 1 | 0 | 0 | 1 | 1 | 1 | 1 | 0 | 0 | 0 | 0 | 0 | 0 | 1 | 1 | 1 |
| UP | 1 | 1 | 0 | 0 | 0 | 0 | 0 | 0 | 1 | 1 | 0 | 0 | 1 | 1 | 1 | 1 |
| MP | 1 | 1 | 1 | 1 | 0 | 0 | 1 | 1 | 1 | 0 | 0 | 0 | 0 | 0 | 0 | 1 |
| LP | 1 | 1 | 1 | 1 | 1 | 0 | 0 | 0 | 0 | 0 | 0 | 1 | 1 | 1 | 0 | 0 |

FIG. 9A2 (900a2)

| | "Er" S0 | "A" S1 | "B" S8 | "C" S9 | "D" S12 | "E" S13 | "F" S14 | "G" S15 |
|---|---|---|---|---|---|---|---|---|
| TP | 1 | 0 | 0 | 0 | 0 | 1 | 1 | 1 |
| UP | 1 | 1 | 1 | 1 | 1 | 1 | 1 | 1 |
| MP | 1 | 1 | 1 | 0 | 0 | 0 | 0 | 1 |
| LP | 1 | 1 | 0 | 0 | 1 | 1 | 0 | 0 |

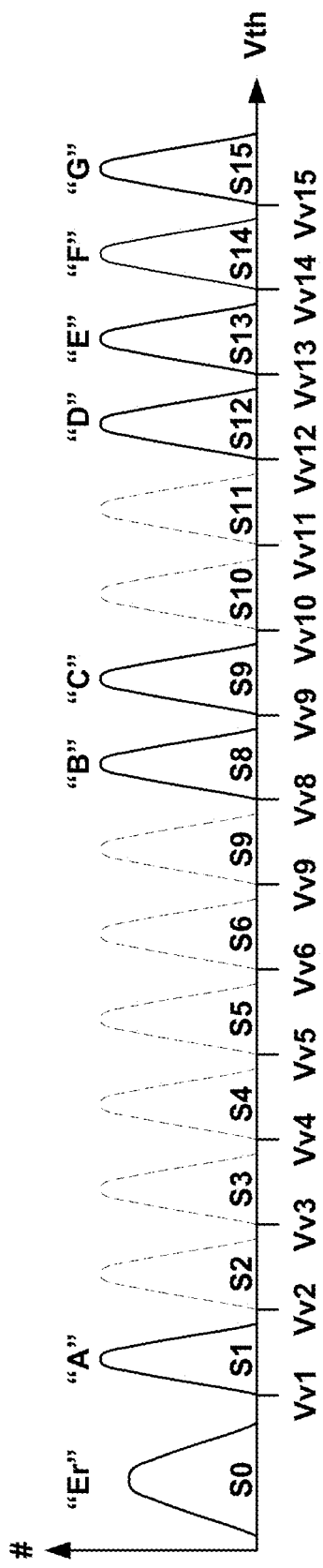
FIG. 9A3
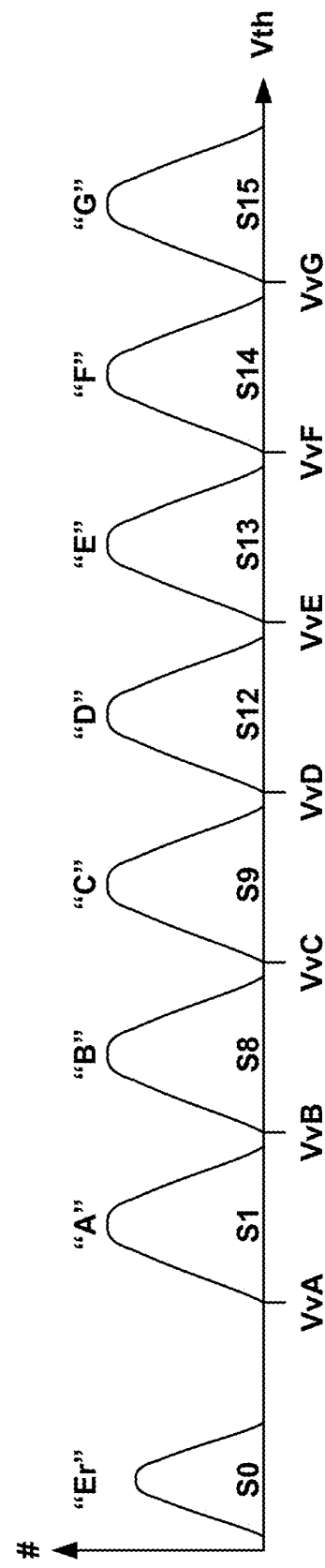
FIG. 9A4

MIXED BITLINE LOCKOUT FOR QLC/TLC DIE

BACKGROUND

The present disclosure relates to non-volatile memory.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. The memory structure may be three-dimensional. One type of three-dimensional structure has non-volatile memory cells arranged as vertical NAND strings. The memory structure may be arranged into units that are commonly referred to as physical blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the block.

For memory such as NAND, a large set of memory cells are first erased. Herein, a set of memory cells that are erased as a unit are referred to as an "erase block." In some cases an erase block coincides with a physical block. In some cases an erase block is a portion of a physical block. Then, the memory cells within the erase block are programmed one group at a time. The unit of programming is typically referred to as a physical page of memory cells. The non-volatile memory cells may be programmed to store data. Typically, the memory cells are programmed to a number of data states. Using a greater number of data states allows for more bits to be stored per memory cell. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell.

During a program operation a series of programming voltage pulses are applied to the control gates of the memory cells. Each voltage pulse may be stepped up in magnitude from a previous program pulse by a step size in a processed referred to as incremental step pulse programming. A program voltage may be followed by one or more verify operation to determine if memory cells have been programmed to a corresponding one or more target data states. In some techniques, only a subset of the target data states are verified after a program loop.

Performing the verify operation can consume a substantial amount of current and/power. Therefore, reducing current and power consumption during verify is advantageous. Also, because a number of verify operations are performed to complete the programming process reducing the time for a particular verify operation improves efficiency by reducing programming time.

BRIEF DESCRIPTION OF THE DRAWINGS

Like-numbered elements refer to common components in the different figures.

FIG. 1 is a block diagram depicting one embodiment of a storage system.

FIG. 3C is a block diagram depicting one embodiment of a portion of column control circuitry that contains a number of read/write circuits.

FIG. 9A1 is a table of an example gray code used to represent sixteen data states.

FIG. 9A2 is a table of an example gray code used to represent eight data states which may be generated from the example gray code of FIG. 9A1.

FIG. 9A3 depicts an embodiment of threshold voltage distributions for an eight-state memory device in which each memory cell stores three bits of data, programmed using the example gray code of FIG. 9A2.

FIG. 9A4 depicts an embodiment of threshold voltage distributions for an eight-state memory device in which each memory cell stores three bits of data, programmed using the example gray code of FIG. 9A2 with tuned verify levels.

DETAILED DESCRIPTION

Figure 2A:
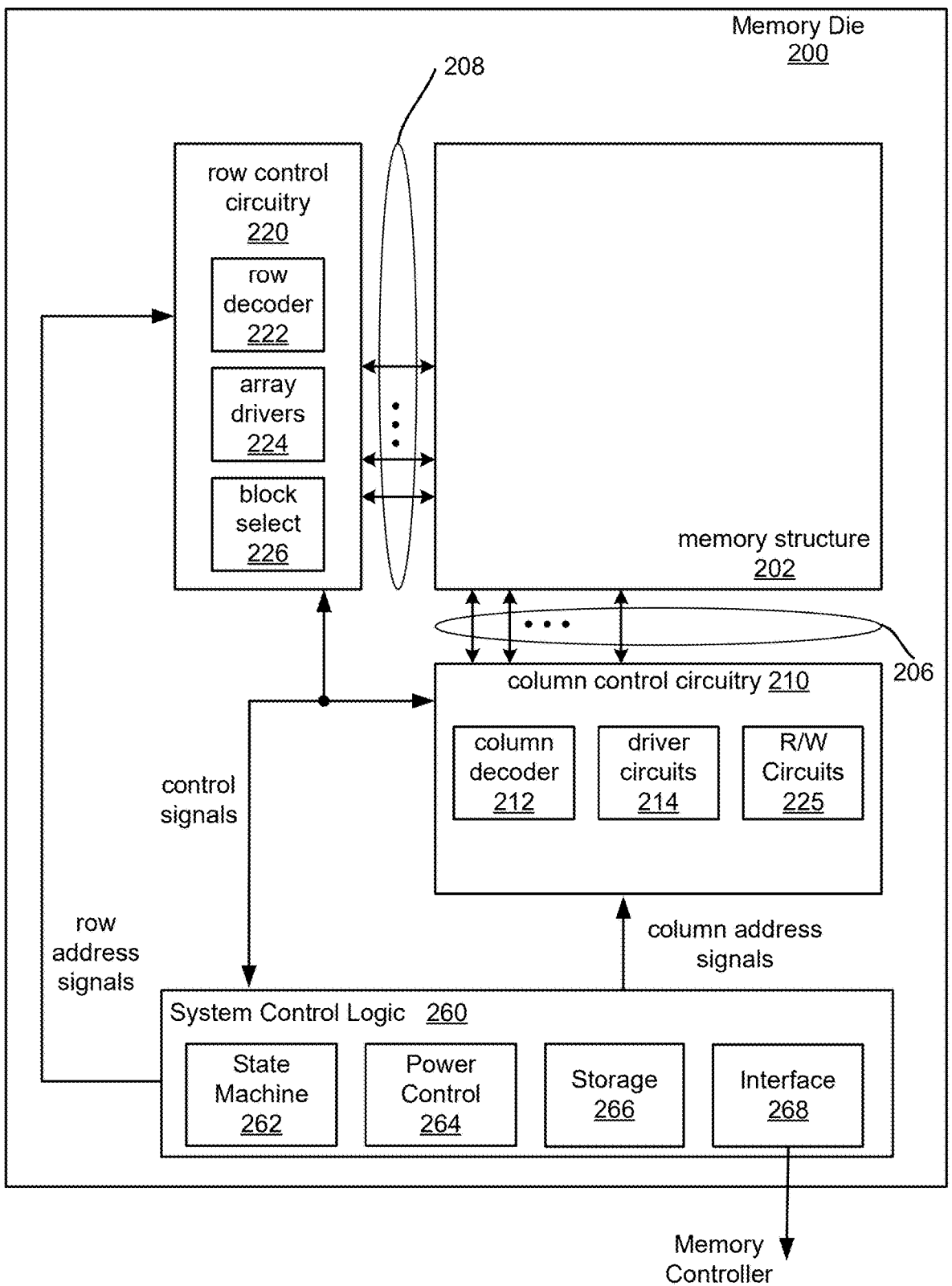
FIG. 2A is a block diagram of one embodiment of a memory die.

Technology is disclosed herein for a mixed lockout during program verify of memory cells. In an embodiment, the memory system programs memory cells in the memory structure in a four bit per cell mode (or X4 mode) and also a three bit per cell mode (or X3 mode). The four bit per cell mode uses a four-bit gray code that has four pages and sixteen data states. The four bit per cell mode uses a three-bit gray code that is based on the four-bit gray code. The three-bit gray code is based on three of the four pages of the four-bit gray code. By basing the three-bit gray code on three of the four pages of the four-bit gray code, a considerable portion of the logic that is used for programming to four bits per cell can also be used for programming to three bits per cell. However, since the three-bit gray code only uses eight of the sixteen states from the four-bit gray code, technical challenges arise for verification using the three-bit gray code.

In an embodiment, in a first programming phase, the memory system programs user data into a group of memory cells based on content in four pages of data latches prior to a pre-determined data state completing verification. During the first programming phase a no-lockout program verify is performed. After the pre-determined data state has completed verification the content of the four pages of data latches may be re-arranged to three pages of data latches. During a second phase of programming, the user data is programmed into the group based on the content in the three pages of data latches. During the second programming phase a lockout program verify is performed. A no-lockout verify as defined herein means to charge, to a sensing voltage, all bit lines associated with a group of memory cells to which a verify reference voltage is applied to control gates. A lockout verify as defined herein means to selectively charge, to the sensing voltage, only bit lines associated with memory cells in the group to be verified when the verify reference voltage is applied to the control gates. Bit lines associated with memory cells in the group that are not to be verified may be grounded to perform the lockout verify.

The lockout verify saves considerable current and/or power relative to the no-lockout verify. However, performing the lockout verify during the first programming phase when the four pages of data latches are used may slow performance due to a need to scan the content in the four pages of data latches. In some embodiments, one of the pages of data latches is located remotely from the other three pages of data latches in order to reduce the number of data latches that are used. For example, three pages of data latches may be located in read/write circuits with a fourth page being located external to the read/write circuits. Thus, scanning the remotely located page of data latches can take much longer than scanning the local data latches in the read/write circuits. However, in some embodiments, after the A-state (of A to G states in an X3 mode) completes verify, the process moves to the second phase that does not use the remote latches. Therefore, scanning the local latches to perform the lockout verify does not significantly impact programming speed. Therefore, performance is not severely impacted and considerable current/power is saved.

FIG. 1 is a block diagram of one embodiment of a storage system 100 that implements the technology described herein. In one embodiment, storage system 100 is a solid state drive ("SSD"). Storage system 100 can also be a memory card, USB drive or other type of storage system. The proposed technology is not limited to any one type of storage system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below. The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, as well as read/write circuitry 225, and I/O multiplexers.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
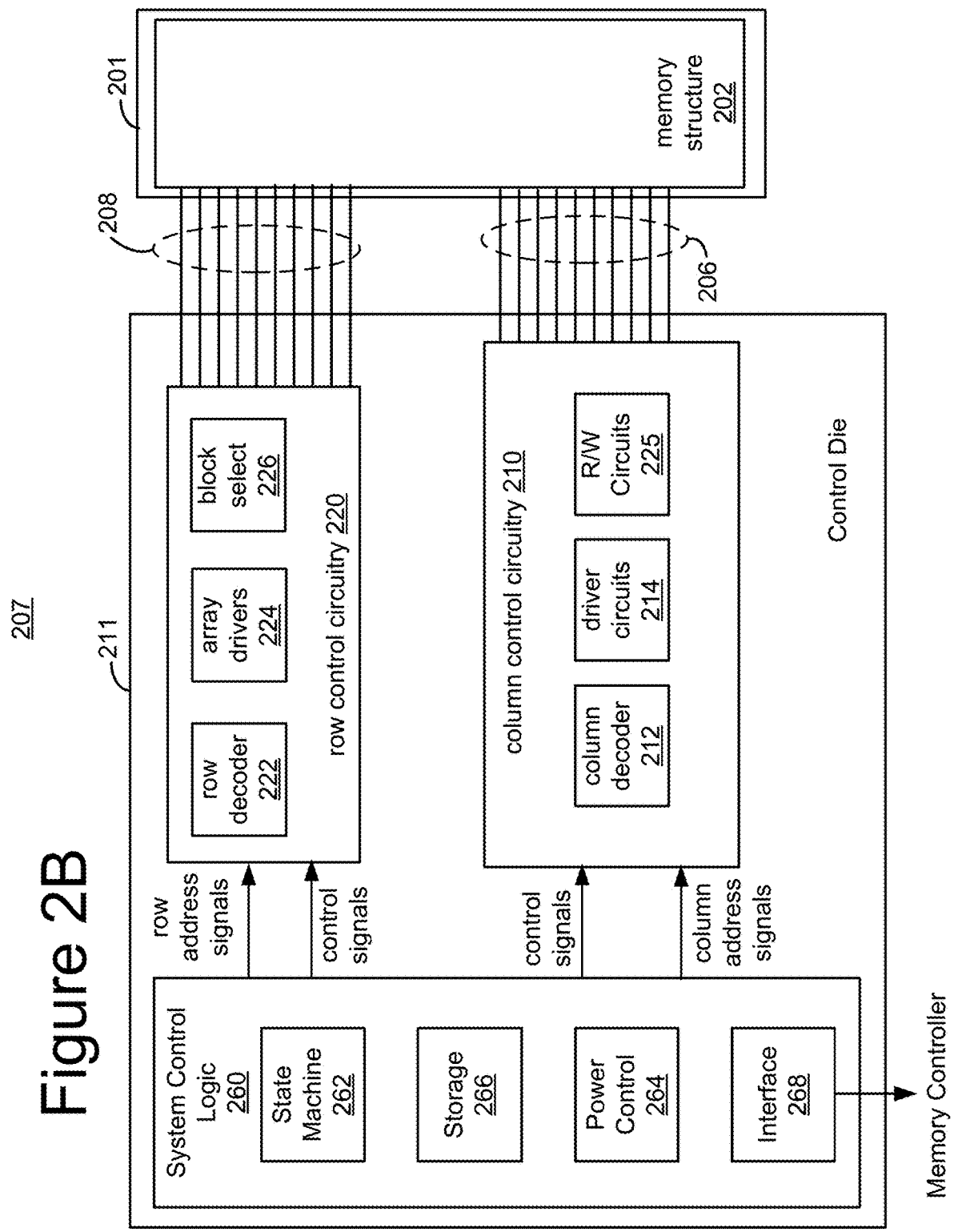
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of storage system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and R/W circuits 225 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, state machine 262, power control 264, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, storage system 100, memory controller 120, storage 130, memory die 200, integrated memory assembly 207, and/or control die 211.

Figure 3A:
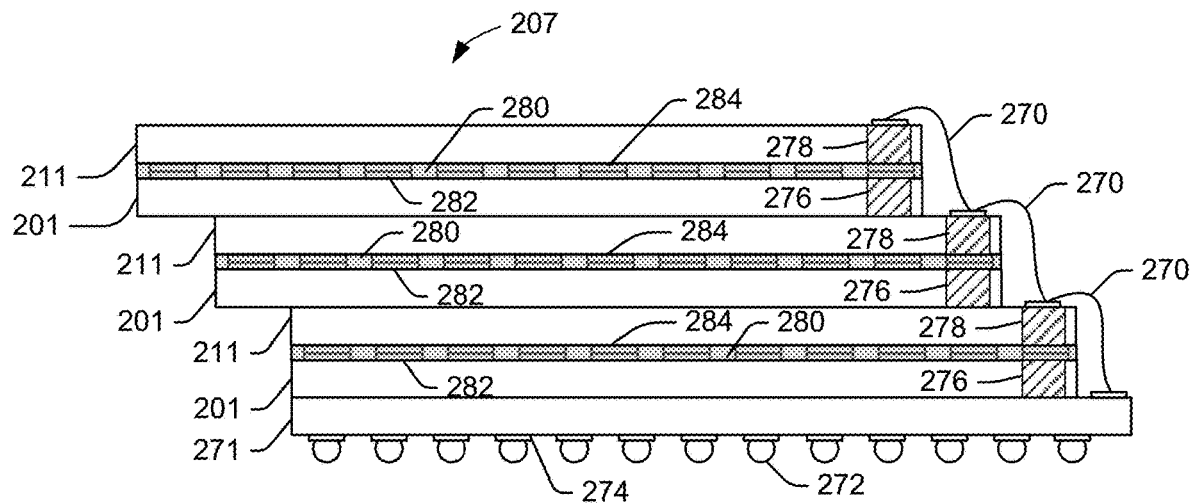
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
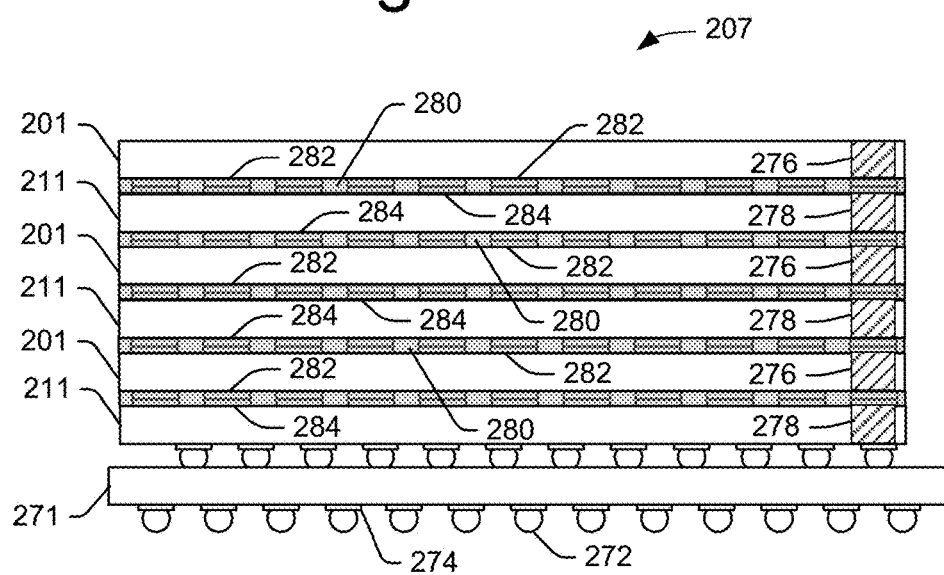

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor die together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

FIG. 3C is a block diagram depicting one embodiment of a portion of column control circuitry 210 that contains a number of read/write circuits 225. Each read/write circuit 225 is partitioned into a sense amplifier 325 and local data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read or verify operation.

The local data latches 340 are coupled to the sense amplifier 325 by a local data bus 346. The local data latches 340 include three latches (ADL, BDL, CDL) for each sense amplifier 325 in this example. More or fewer than three latches may be included in the local data latches 340. In one embodiment, for programming each local data latch 340 is used to store one bit to be stored into a memory cell and for reading each data latch 340 is used to store one bit read from a memory cell. In a four bit per memory cell embodiment, ADL stores a bit for a lower page of data, BDL stores a bit for a middle page of data, CDL stores a bit for an upper page of data. Optionally a further local data latch (DDL) may be located in the local data latches 340 for a fourth page of data. Each read/write circuit 225 is connected to a remote XDL latch 348 by way of an XDL bus 352. In this example, transistor 336 connects local data bus 346 to XDL bus 352. An I/O interface 332 is connected to the remote XDL latches 348. The remote XDL latch 348 associated with a particular read/write circuit 225 serves as an interface latch for storing/latching data from the memory controller. In one embodiment, latch space is saved by not including the local DDL latches, but instead using the remote XDL latches 348 for a top page of data. However, using the XDL latches 348 for the top page may slow programming. For example, communicating over the XDL bus 352 to obtain the content of the remote XDL latches 348 may take considerably more time than obtaining the content of the local data latches 340. In some embodiments, programming time is saved by performing a no-lockout verify when the content of the remote XDL latches 348 is used in programming. However, current and/or power is saved by performing a lockout verify when programming does not need any content in the remote XDL latches 348.

In one embodiment, the memory cells are programmed to three bits per cell using at least some of the programming algorithm for programming memory cells to four bits per cell. In one embodiment, the three bit per cell mode has a similar coding scheme to the four bit per cell mode by using three pages of the four pages from the four bit per cell mode. In one embodiment, one of the latches 340 will be set to a default value in the three bit per cell mode, based on which page of the four page code is not used. For example, the three bit mode may use the coding from the lower page, middle page, and top page of the four page code (thereby not using the upper page). In this example, a first page of user data may be stored in the ADL latches, a second page of user data may be stored in the BDL latches, and the third page of user data may be stored in the XDL latches (or DDL latches in local latches 340 if DDL latches are present). However, the CDL latches may be set to a default value (e.g., all ones or all zeroes). This technique simplifies the logical circuitry by allowing some of the four page code programming circuitry to be used for programming in the three page code. Techniques are disclosed herein for verifying the memory cells in a three page programming mode.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. In some embodiments, the managing circuit 330 scans the local latches 340 to determine which bit lines to charge to a sensing voltage and which bit lines to ground in a lockout verify. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, data to be programmed (write data) may be stored in the set of data latches 340 from the data bus 334 by way of XDL latches 348. However, note that one option is to use the XDL latches 348 to store user data during at least a portion of the program operation. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to a desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate. Note that the verification phase does not need to verify all of the data states following each program pulse.

Figure 4:
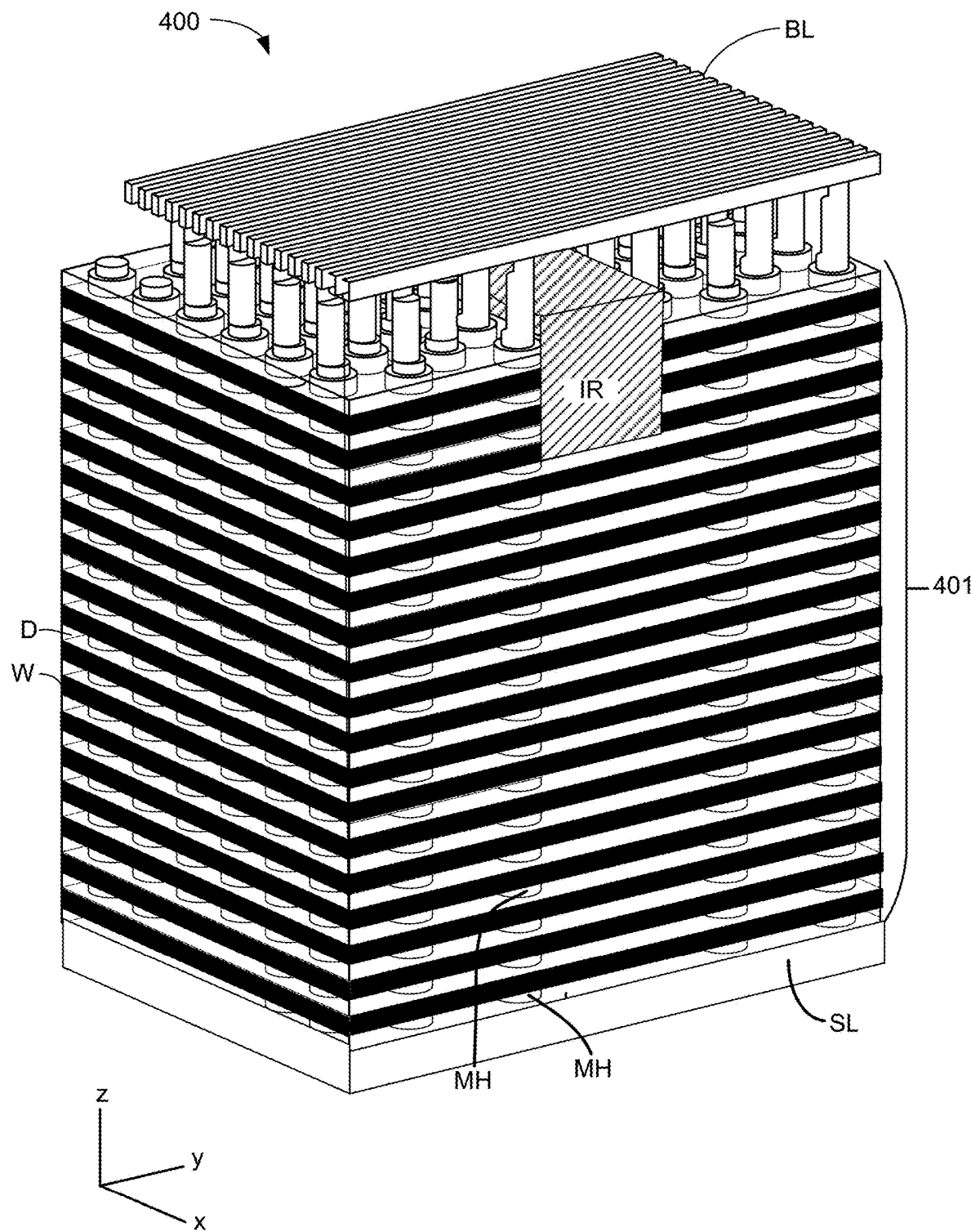
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. In one embodiment the alternating dielectric layers and conductive layers are divided into four (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
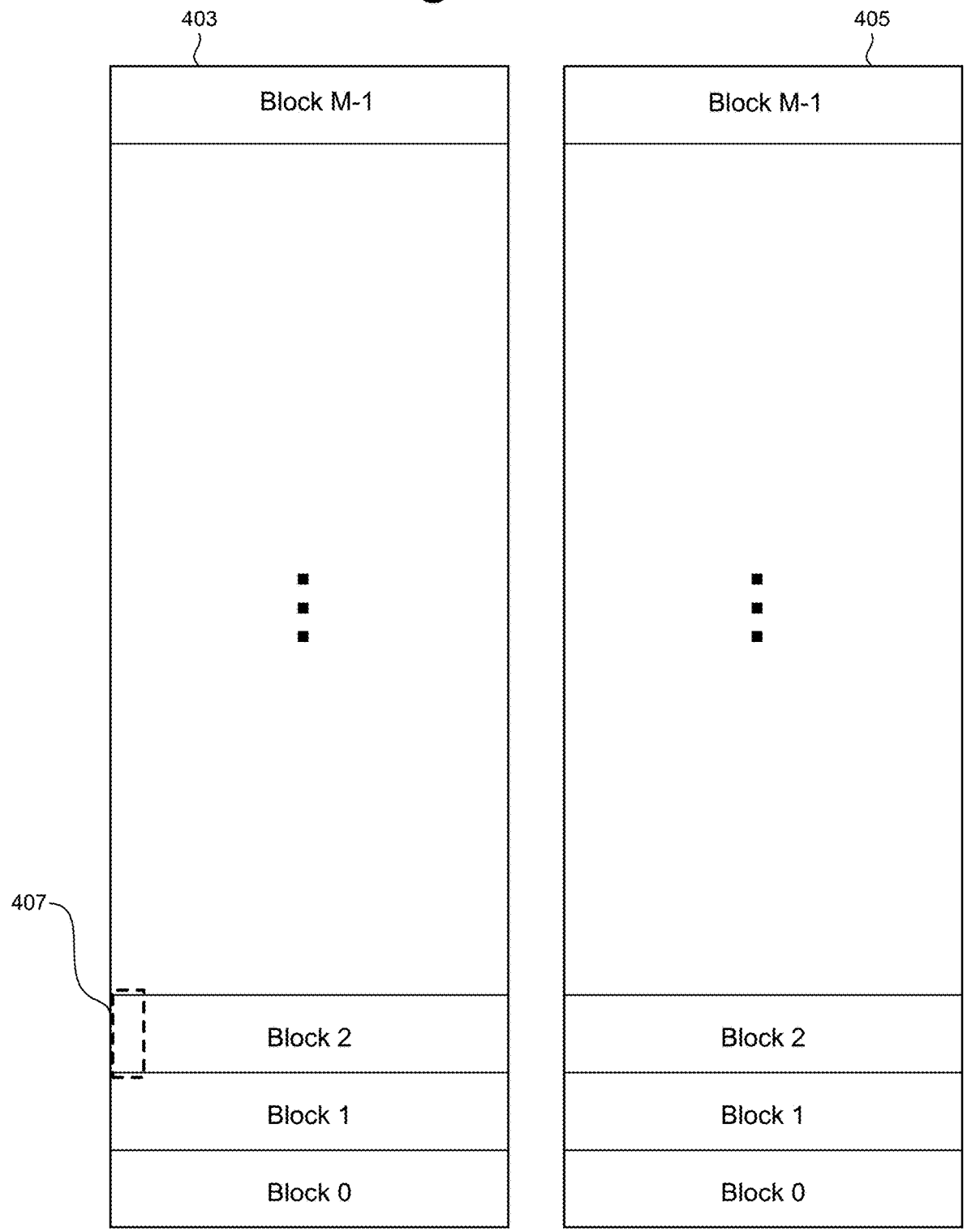
FIG. 4A is a block diagram of one embodiment of a memory structure having two planes.

FIG. 4A is a block diagram explaining one example organization of memory structure 202, which is divided into two planes 403 and 405. Each plane is then divided into M physical blocks. In one example, each plane has about 2000 physical blocks. However, different numbers of physical blocks and planes can also be used. In one embodiment, a physical block of memory cells is a unit of erase. That is, all memory cells of a physical block are erased together. In other embodiments, physical blocks can be divided into sub-blocks and the sub-blocks can be the unit of erase. Memory cells can also be grouped into physical blocks for other reasons, such as to organize the memory structure to enable the signaling and selection circuits. In some embodiments, a physical block represents a group of connected memory cells as the memory cells of a block share a common set of word lines. For example, the word lines for a physical block are all connected to all of the vertical NAND strings for that physical block. Although FIG. 4A shows two planes 403/405, more or fewer than two planes can be implemented. In some embodiments, memory structure 202 includes four planes. In some embodiments, memory structure 202 includes eight planes. In some embodiments, programming can be performed in parallel in a first selected block in plane 403 and a second selected block in plane 405.

Figure 4B:
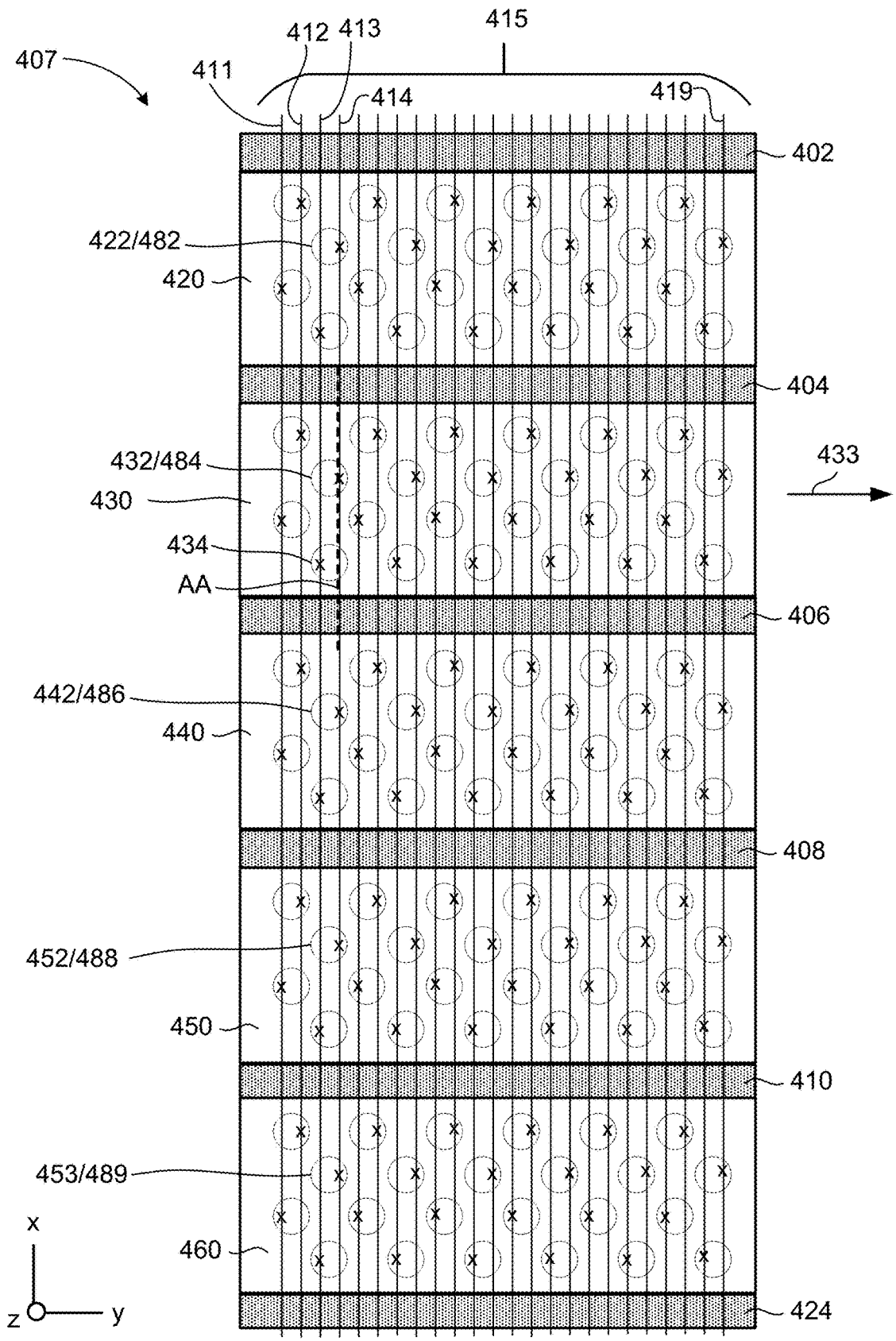
FIG. 4B is a block diagram depicting a top view of a portion of physical block of memory cells.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, 452 and 453. Vertical column 422 implements NAND string 482. Vertical column 432 implements NAND string 484. Vertical column 442 implements NAND string 486. Vertical column 452 implements NAND string 488. Vertical column 453 implements NAND string 486. Vertical column 452 implements NAND string 489. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, 410, and 424, which are formed of $SiO_2$; however, other dielectric materials can also be used. Isolation regions 402, 404, 406, 408, 410, and 424 serve to divide the top layers of the physical block into five regions; for example, the top layer depicted in FIG. 4B is divided into regions 420, 430, 440, 450, and 460 of which are referred to as sub-blocks. In one embodiment, isolation regions 402 and 424 separate the physical block 407 from adjacent physical blocks. Thus, isolation regions 402 and 424 may extend down to the substrate. In one embodiment, the isolation regions 404, 406, and 410 only divide the layers used to implement select gates so that NAND strings in different sub-blocks can be independently selected. Referring back to FIG. 4, the IR region may correspond to any of isolation regions 404, 406, or 408. In one example implementation, a bit line only connects to one vertical column/NAND string in each of regions (sub-blocks) 420, 430, 440, 450, and 460. In that implementation, each physical block has twenty rows of active columns and each bit line connects to five rows in each block. In one embodiment, all of the five vertical columns/NAND strings connected to a common bit line are connected to the same word line (or set of word lines); therefore, the system uses the drain side selection lines to choose one (or another subset) of the five to be subjected to a memory operation (program, verify, read, and/or erase).

Although FIG. 4B shows each region (420, 430, 440, 450, 460) having four rows of vertical columns, five regions (420, 430, 440, 450, 460) and twenty rows of vertical columns in a block, those exact numbers are an example implementation. Other embodiments may include more or fewer regions (420, 430, 440, 450, 460) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
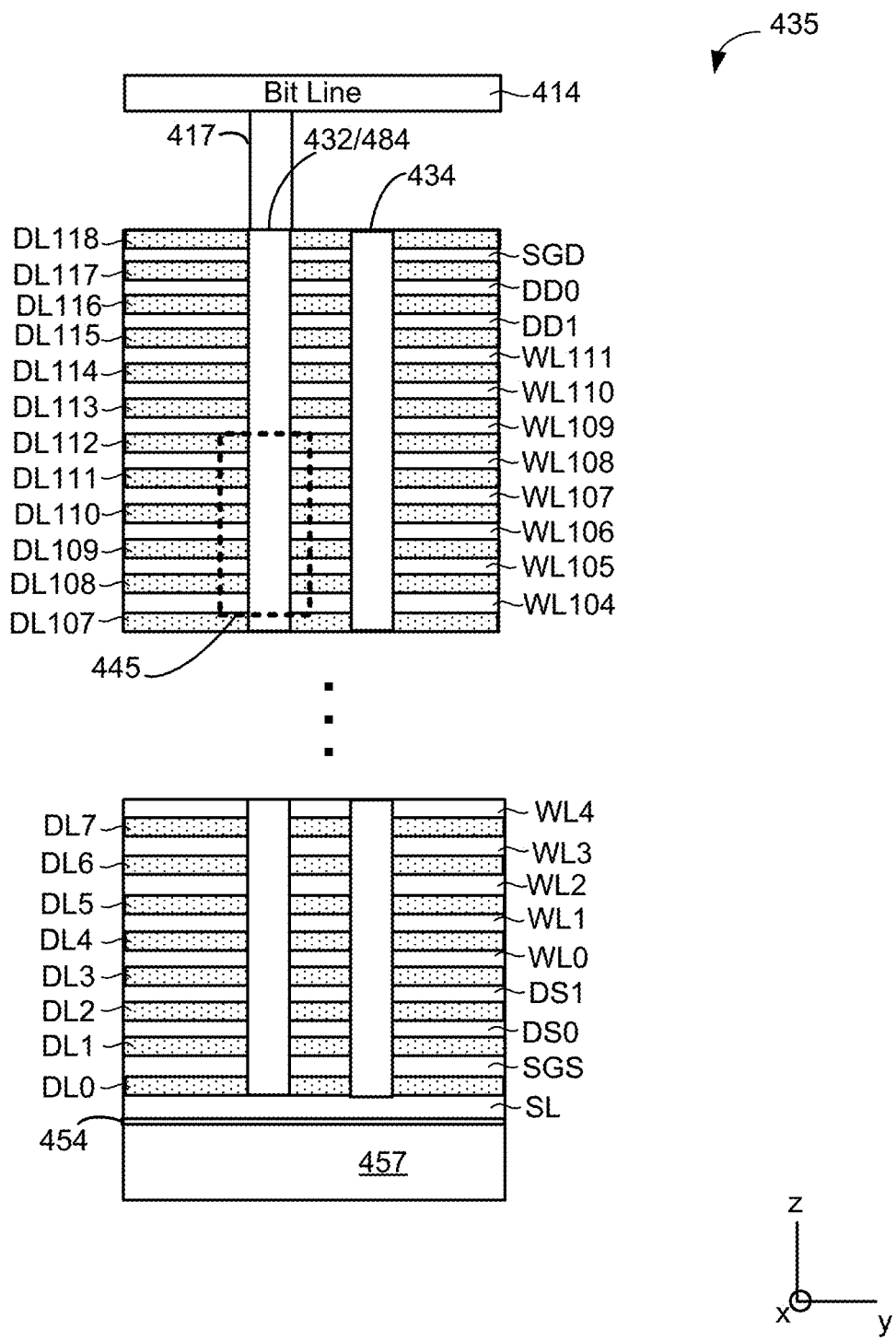
FIG. 4C depicts an embodiment of a stack showing a cross-sectional view along line AA of FIG. 4B.

FIG. 4C depicts an embodiment of a stack 435 showing a cross-sectional view along line AA of FIG. 4B. An SGD layer (SGD), an SGS layer (SGS) and four dummy word line layers DD0, DD1, DS1, and DS0 are provided, in addition to the data word line layers WL0-WL111. Each NAND string has a drain side select transistor at the SGD layer. Each NAND string has a source side select transistor at the SGS layer. There may be more than one SGD layer, as well as more than one SGS layer. Also depicted are dielectric layers DL0-DL118.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 417 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. Drain side select layer SGD is used to electrically connect and disconnect (or cut off) the channels of respective NAND strings from bit lines. Source side select layer SGS is used to electrically connect and disconnect (or cut off) the channels of respective NAND strings from the source line SL.

Figure 4D:
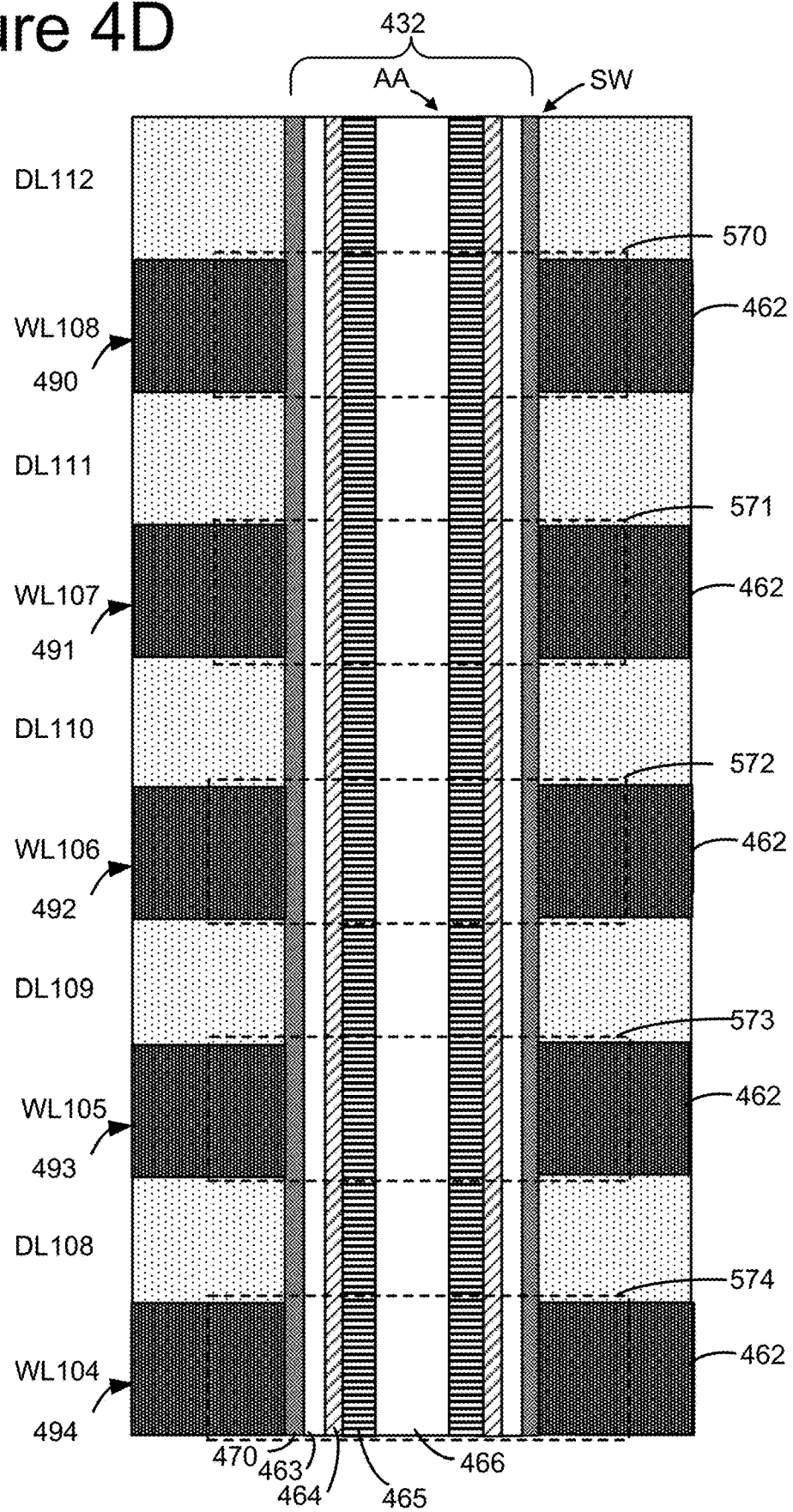
FIG. 4D depicts a view of the region 445 of FIG. 4C.

FIG. 4D depicts a view of the region 445 of FIG. 4C. Data memory cell transistors 570, 571, 572, 573, and 574 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vth of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
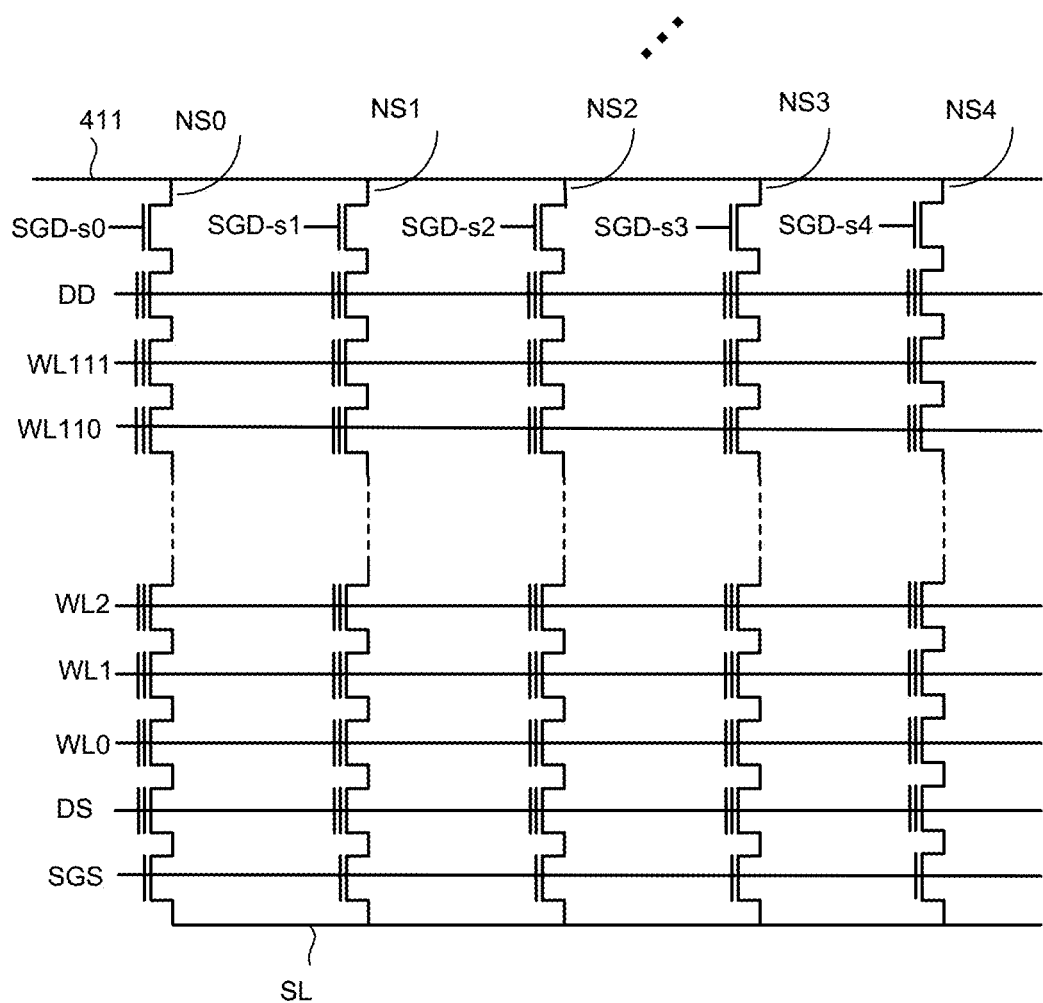
FIG. 4E is a schematic diagram of a portion of one embodiment of a physical block, depicting several NAND strings.

FIG. 4E is a schematic diagram of a portion of the memory structure 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to five NAND strings. Thus, FIG. 4E shows bit line connected to NAND string NS0, NAND string NS1, NAND string NS2, NAND string NS3, and NAND string NS4.

In one embodiment, there are five drain side select lines in the physical block (SGD-s0, SGD-s1, SGD-s2, SGD-s3, and SGD-s4). Each respective drain side select line can be selected independent of the others. Each drain side select line connects to a group of NAND strings in the block. Only one NAND string of each group is depicted in FIG. 4E. These five drain side select lines correspond to five sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. As noted, FIG. 4E only shows the NAND strings connected to bit line 411. However, a full schematic of the block would show every bit line and five vertical NAND strings connected to each bit line.

In one embodiment, all of the memory cells on the NAND strings in a physical block are erased as a unit. However in some embodiments, a physical block is operated as an upper tier and a lower tier, wherein the upper tier and the lower tier each form an erase block. For example, memory cells connected to WL0-WL61 may be in the lower tier and memory cells connected to WL62-WL111 may be in the upper tier. Hence, memory cells connected to WL0-WL61 may be in one erase block and memory cells connected to WL62-WL111 may be in another erase block. A physical block could be operated in more than two tiers. Erase blocks can be formed based on other divisions of physical blocks.

Although the example memories of FIGS. 4-4E are three dimensional memory structure that includes vertical NAND strings with charge-trapping material, other (2D and 3D) memory structures can also be used with the technology described herein.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

The memory systems discussed above can be erased, programmed and read. Each memory cell may be associated with a memory state according to write data in a program command. Based on its memory state, a memory cell will either remain in the erased state or be programmed to a memory state (a programmed memory state) different from the erased state.

For example, in a two-bit per cell memory device (sometimes referred to as a multi-level cell (MLC)), there are four memory states including the erased state and three programmed memory states referred to as the A, B and C memory states. In a three-bit per cell memory device (sometimes referred to as a tri-level cell (TLC)), there are eight memory states including the erased state and seven programmed memory states referred to as the A, B, C, D, E, F and G memory states. In a four-bit per cell memory device (sometimes referred to as a quad-level cell (QLC)), there are sixteen memory states including the erased state and fifteen programmed memory states referred to as the Er, S1, S2, S3, S4, S5, S6, S7, S8, S9, S10, S11, S12, S13, S14 and S15 memory states.

Figure 5A:
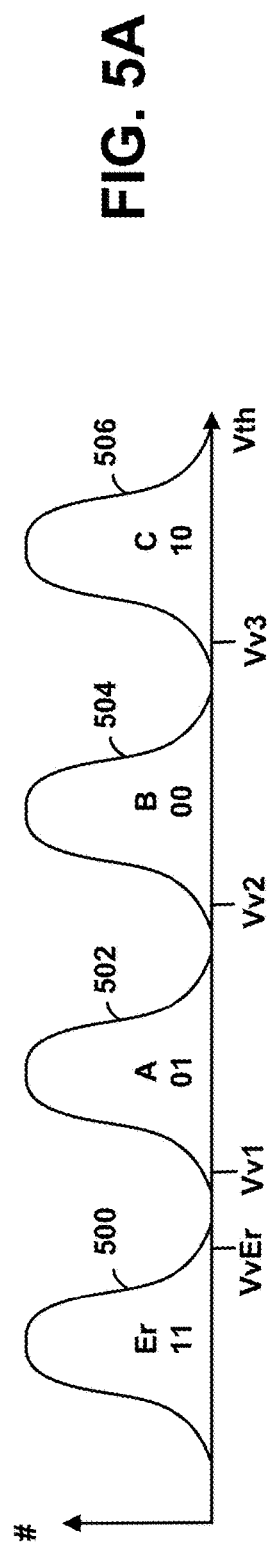
FIG. 5A depicts an embodiment of threshold voltage Vth distributions for a four-state memory device in which each memory cell stores two bits of data.

FIG. 5A depicts an embodiment of threshold voltage Vth distributions for a four-state memory device in which each memory cell stores two bits of data. A first threshold voltage Vth distribution 500 is provided for erased (Er-state) storage elements. Three threshold voltage Vth distributions 502, 504 and 506 represent programmed memory states A, B and C, respectively. A 2-bit code having lower and upper bits can be used to represent each of the four memory states. In an embodiment, the "Er," "A," "B," and "C" memory states are respectively represented by "11," "01," "00," and "10."

Figure 5B:
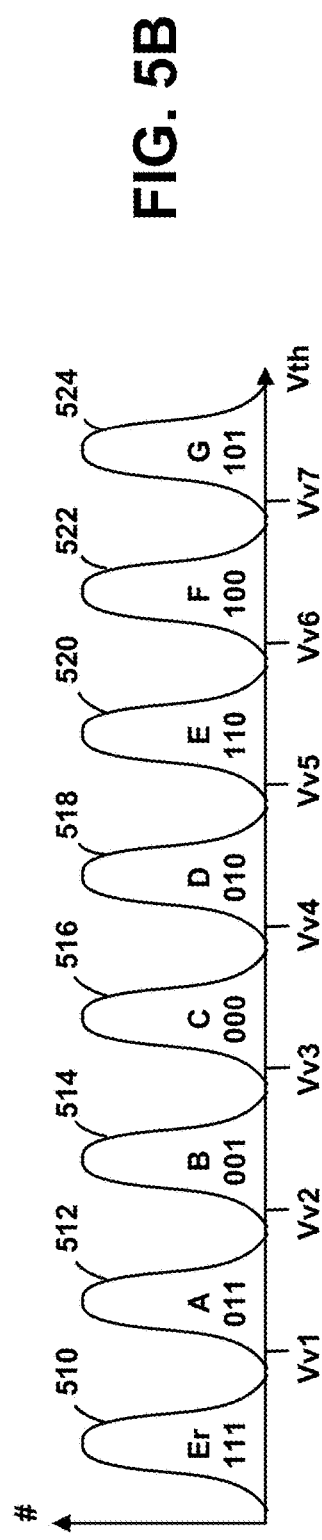
FIG. 5B depicts an embodiment of threshold voltage Vth distributions for an eight-state memory device in which each memory cell stores three bits of data.

FIG. 5B depicts an embodiment of threshold voltage Vth distributions for an eight-state memory device in which each memory cell stores three bits of data. A first threshold voltage Vth distribution 510 is provided for Er-state storage elements. Seven threshold voltage Vth distributions 512, 514, 516, 518, 520, 522 and 524 represent programmed memory states A, B, C, D, E, F and G, respectively. A 3-bit code having lower page, middle page and upper page bits can be used to represent each of the eight memory states. In an embodiment, the "Er," "A," "B," "C," "D," "E," "F" and "G" memory states are respectively represented by "111," "011," "001," "000," "010," "110," "100" and "101."

Figure 5C:
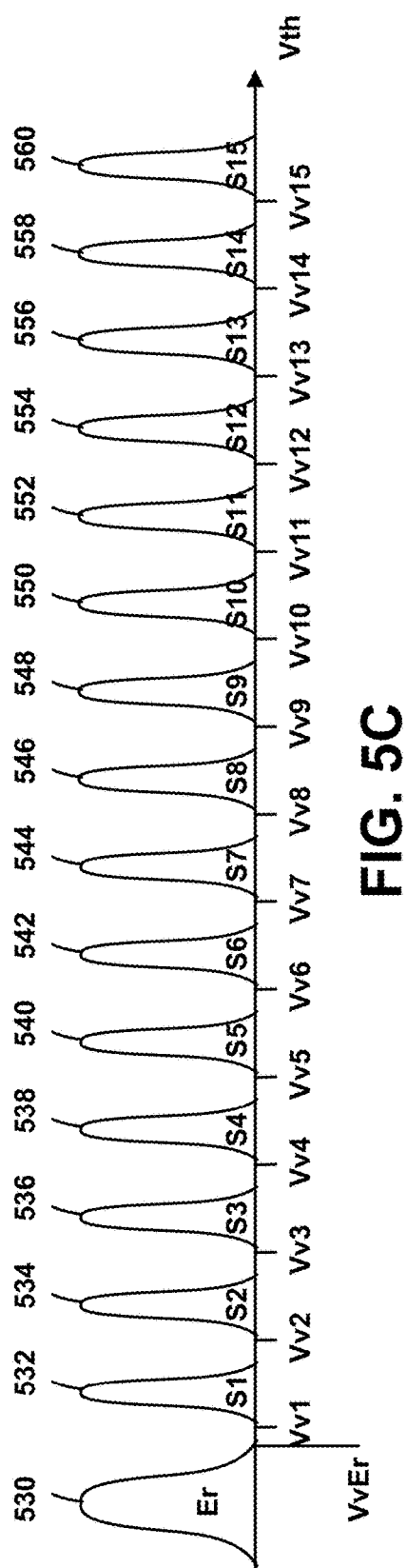
FIG. 5C depicts an embodiment of threshold voltage Vth distributions for a sixteen state memory device in which each memory cell stores four bits of data.

FIG. 5C depicts an embodiment of threshold voltage Vth distributions for a sixteen-state memory device in which each memory cell stores four bits of data. A first threshold voltage Vth distribution 530 is provided for erased Er-state storage elements. Fifteen threshold voltage Vth distributions 532, 534, 536, 538, 540, 542, 544, 546, 548, 550, 552, 554, 556, 558 and 560 represent programmed memory states S1, S2, S3, S4, S5, S6, S7, S8, S9, S10, S11, S12, S13, S14 and S15, respectively.

A 4-bit code having lower page, middle page, upper page and top page bits can be used to represent each of the sixteen memory states. In an embodiment, the S0, S1, S2, S3, S4, S5, S6, S7, S8, S9, S10, S11, S12, S13, S14 and S15 memory states are respectively represented by "1111," "1110,"

"1100," "1101," "1001," "0001," "0101," "0100," "0110," "0010," "0000," "1000," "1010," "1011," "0011," and "0111," respectively.

The technology described herein also can be used with other types of programming in addition to full sequence programming (including, but not limited to, multiple stage/phase programming). In some embodiments, programmed states (e.g., S1-S15) can overlap, with controller 120 (FIG. 1) relying on error correction to identify the correct data being stored.

Figure 6:
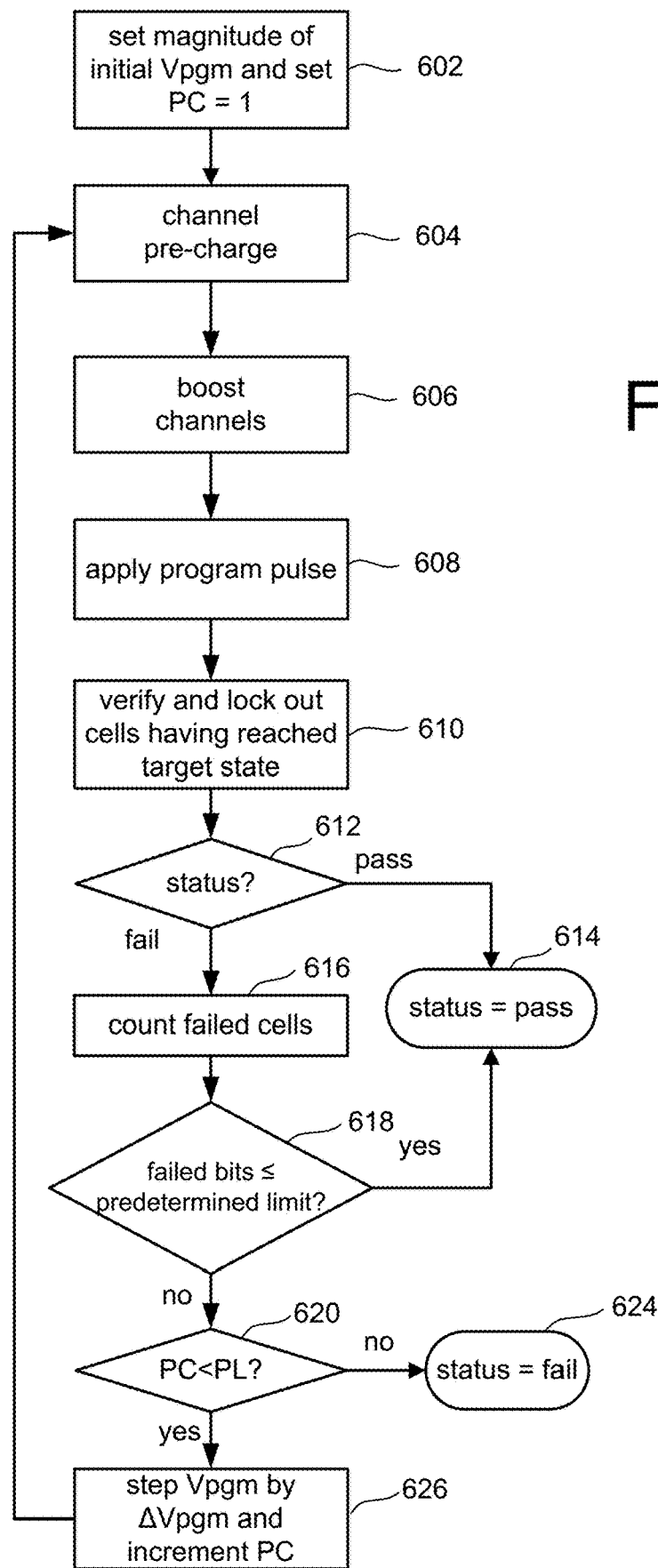
FIG. 6 is a flowchart describing one embodiment of a process for programming memory cells.

FIG. 6 is a flowchart describing one embodiment of a process for programming memory cells. For purposes of this document, the term program and programming are synonymous with write and writing. In one example embodiment, the process of FIG. 6 is performed for memory structure 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. Embodiments are disclosed herein for determining which of the data states should be verified in each loop of the programming process. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage. In one embodiment, one or more data latches in the managing circuit 330 are used to indicate whether a memory cell is locked out or is to receive full programming.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In one embodiment, the number of memory cells that have a Vt at or above a certain verify reference voltage are counted in step 616. In an embodiment, verification of a data state depends on whether the count of cells above the verify reference voltage exceeds a certain number. For example, verification of the B-state on the next PV loop may depend on whether the count of cells having a Vt above the A-state verify voltage is greater than a certain number.

In step 618, it is determined whether the count of failed cells from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-626) of the programming process of FIG. 6 is performed.

Figure 7:
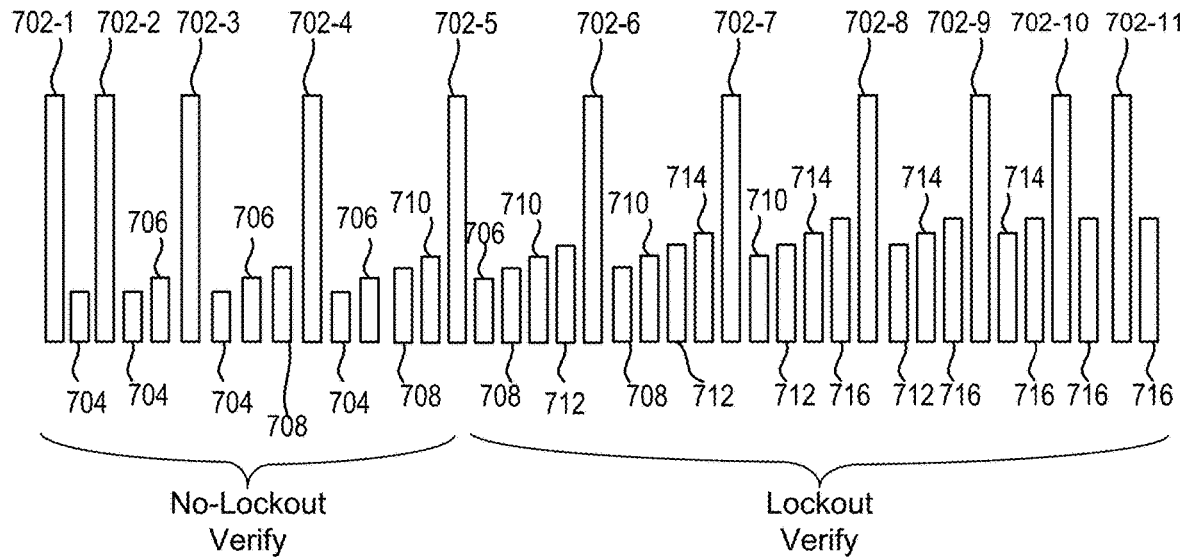
FIG. 7 depicts a possible scheme that will verify selected states each PV loop.

As noted above, the programming may include a series of program/verify loops. Typically not all states are verified each PV loop. FIG. 7 depicts a possible scheme that will verify selected states each PV loop. A total of eleven program voltages 702-1 to 702-11 are depicted. In FIG. 7, verification of the A-state starts after the first program pulse 702-1, as indicated by verification pulse 704; verification of the B-state starts after the second program pulse 702-2, as indicated by verification pulse 706; verification of the C-state starts after the third program pulse 702-3, as indicated by verification pulse 708; verification of the D-state starts after the fourth program pulse 702-4, as indicated by verification pulse 710; verification of the E-state starts after the fifth program pulse 702-5, as indicated by verification pulse 712; verification of the F-state starts after the sixth program pulse 702-6, as indicated by verification pulse 714; and verification of the G-state starts after the seventh program pulse 702-7, as indicated by verification pulse 716. Verification for a state may stop after all but a few cells have reached that state. The technique depicted in FIG. 7 may be relatively simple to implement due to each state's verification starting at a pre-determined PV loop. In an embodiment, a no-lockout verify is performed in a first programming phase while the A-state is still being verified. In FIG. 7, this no-lockout verify is performed for the first four PV loops. A lockout verify is performed for the remaining PV loops, which may be referred to as a second programming phase.

Figure 8:
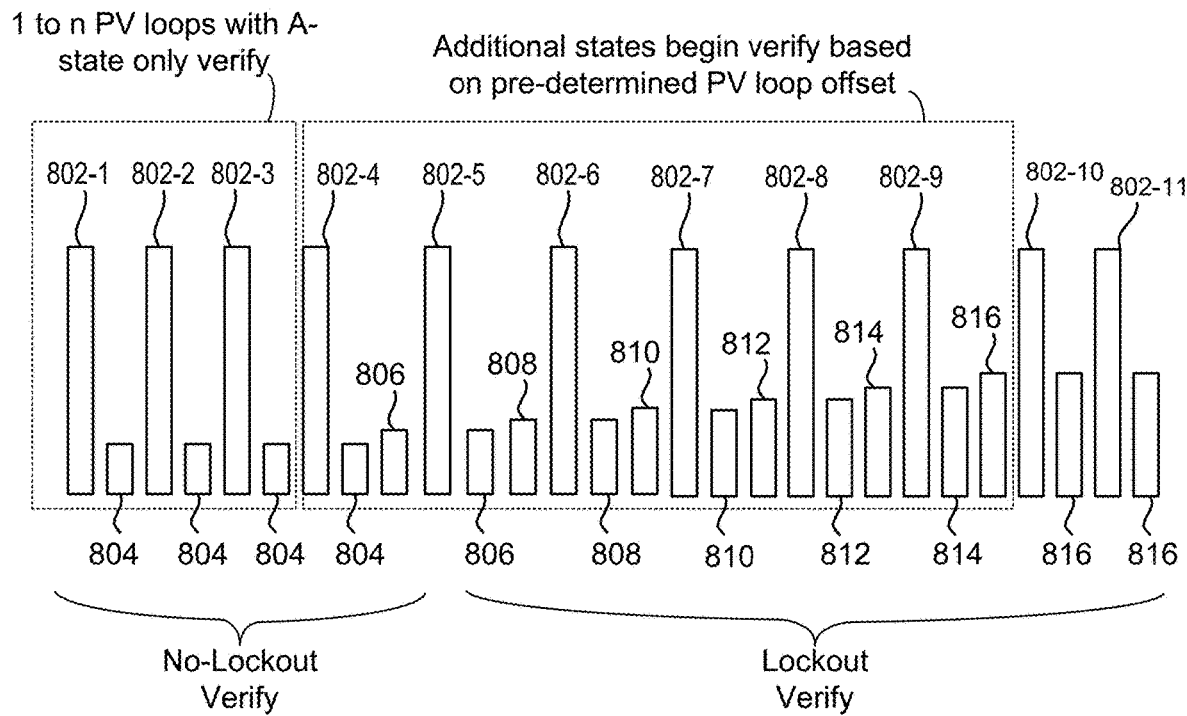
FIG. 8 depicts another embodiment of a verification scheme for X3 programming.

FIG. 8 depicts another embodiment of a verification scheme for X3 programming. A total of eleven program voltages 802-1 to 802-11 are depicted. The embodiment of verification depicted in FIG. 8 will verify only the A-state for 1 to n program/verify (PV) loops (pulses 804). Therefore, verify of the B-state through the G-states are skipped for 1 to n PV loops, which reduces the total number of verify operations. The determination is based on a count of memory cells having a Vt above the A-state verify level. For the sake of example, n is depicted as being 3 PV loops in FIG. 8, but n could be lower or higher than 3. After a certain number of memory cells have a Vt above the A-state verify then B-state verify (pulses 806) begins in the next PV loop. Verification for the C-state (pulses 808) through the G-state begins a pre-determined number of PV loops after verification starts for the immediately preceding state. For example, verification for the C-state begins 1 PV loop after verification of the B-state begins, verification for the D-state (pulses 810) begins 1 PV loop after verification of the C-state begins, verification for the E-state (pulses 812) begins 1 PV loop after verification of the D-state begins, verification for the F-state (pulses 814) begins 1 PV loop after verification of the E-state begins, verification for the G-state (pulses 812) begins 1 PV loop after verification of the F-state begins. In this example, the number of PV loops to wait to begin verification of the next state is one; however, two or more PV loops could be used. Also, it is not required that all states wait the same number of PV loops after verification of the immediately preceding state. The selection of which states to verify on a given PV loop is not limited to the examples depicted in FIGS. 7 and 8. In an embodiment, a no-lockout verify is performed while the A-state is still being verified. In FIG. 8, this no-lockout verify is performed for the first four PV loops. A lockout verify is performed for the remaining PV loops. Note that in some cases the A-state could complete verification in fewer PV loops such that the lockout verify could begin in an earlier PV loop.

Technology is disclosed herein in which memory cells in a memory structure 202 (on memory die 200 or memory structure die 201) may be programmed in a four bit per cell mode (also referred to as QLC, X4 or four page code) or may be programmed in a three bit per cell mode (also referred to as TLC, X3 or three page code). In an embodiment, the system control logic 260 (on either memory die 200 or control die 211) is able to perform an X4 programming algorithm and an X3 programming algorithm. In order to reduce the amount of logic circuitry for programming, at least some of the logic circuitry that is used for X4 programming is also used for X3 programming. In an embodiment, the logic circuits may implement a QLC programming algorithm (gray code and logic) to program 4-bit data in memory cells. In an embodiment, the logic circuits also may implement a TLC programming algorithm (gray code and logic) based on the QLC programming algorithm to program 3-bit data in memory cells. However, technical challenges arise in verifying the memory cells when TLC programming based on the QLC programming algorithm. An embodiment of logical circuits disclosed herein perform decide which bit lines to charge during verify when TLC programming is based on the QLC programming algorithm.

In an embodiment, an existing QLC gray code is used to generate a TLC gray code. FIG. 9A1 is a table of an example QLC gray code 900a1 used to represent sixteen data states. In particular, QLC gray code 900a1 depicts values for lower page (LP), middle page (MP), upper page (UP) and top page (TP) bits for sixteen data states S0, S1, . . . S15. For example, for state S3 the LP, MP, UP and TP bits are 1101, respectively, for state S9 the LP, MP, UP and TP bits are 0010, respectively, and so on.

Example QLC gray code 900a1 is sometimes referred to as a "3-4-4-4 code," which refers to the number of read levels for each page, where a read level usually occurs at a transition from 0 to 1 or 1 to 0. So in the example of FIG. 9A1, there are 3 read levels for LP (S4 to S5 transition, S10 to S11 transition, and S13 to S14 transition), 4 read levels for MP (S3 to S4 transition, S5 to S6 transition, S8 to S9 transition and S14 to S15 transition), 4 read levels for UP (S1 to S2 transition, S7 to S8 transition, S9 to S10 transition and S11 to S12 transition), and 4 read levels for TP (S0 to S1 transition, S2 to S3 transition, S6 to S7 transition and S12 to S13 transition). Persons of ordinary skill in the art will understand that QLC gray codes other than the example QLC gray code 900a1 of FIG. 9A1 may be used.

In embodiments, a TLC gray code is generated from a QLC gray code by setting all bits of one of LP, MP, UP and TP to 1 or 0. In an embodiment, a control circuit (e.g., one or more of system control logic 260, read/write circuits 225, row decoder 222 and column decoder 212) sets UP=1. QLC gray code 900a1 shows in dashed line all data states with UP=1. FIG. 9A2 is a table of an example TLC gray code 900a2 which may be generated from the example QLC gray code 900a1 of FIG. 9A1 by setting UP=1. That is, UP=1 for QLC data states S0, S1, S8, S9 and S12-S15. User data is input as three pages of data to LP, MP and TP, as shown in FIG. 9A2.

The example TLC gray code 900a2 is sometimes referred to as a "2-3-2 code," which refers to the number of read levels for each page, where a read level usually occurs at a transition from 0 to 1 or 1 to 0. So in the example of FIG. 9A2, there are 3 read levels for LP (S1 to S8 transition, S9 to S12 transition, and S13 to S14 transition), 2 read levels for MP (S8 to S9 transition and S14 to S15 transition), and 2 read levels for TP (S0 to S1 transition and S12 to S13 transition).

FIG. 9A3 depicts an embodiment of threshold voltage Vth distributions for an X3 programming mode in which each memory cell stores three bits of data, programmed using example TLC gray code 900a2 generated from the example QLC gray code 900a1 of FIG. 9A1 with UP=1. As depicted in the example, states S2-S7 and S10-S11 have no memory cells assigned to those states. Thus, the following 8 states remain: S0, S1, S8, S9, S12, S13, S14 and S15, which are assigned as TLC states "Er," "A,", "B," "C," "D," "E," "F," and "G," respectively.

In an embodiment, one of the data latches (e.g., the UP data latch) is forced to a value of 1, and then the X4 logic on the die (e.g., 200, 211) implements a QLC programming algorithm to program memory cells as TLC memory cells. Instead of 16 data states, 8 data states will result, such as depicted in the example threshold voltage Vth distribution FIG. 9A3 or 9A4.

Although the threshold voltage Vth distribution FIG. 9A3 may be used as is, the threshold voltage Vth distributions alternatively may be spaced more evenly. In an embodiment, a control circuit (e.g., one or more of system control logic 260, read/write circuits 225, row decoder 222 and column decoder 212) tunes the verify levels Vv1, Vv8, Vv9, Vv12, Vv13, Vv14 and Vv15 of the 7 programmed data states S1, S8, S9, S12, S13, S14 and S15, respectively, so that the threshold voltage Vth distribution is more evenly spaced, such as in the example threshold voltage Vth distribution depicted in FIG. 9A4 (having verify levels VvA, VvB, VvC, VvD, VvE, VvF, and VvG).

In some embodiments, a smart verify is performed for X4 programming. Smart verify can also be referred to as skip verify. In an embodiment of smart verify for X4 programming, the system determines which PV loop to start verifying a particular state based on whether the number of memory cells having a Vt above the verify voltage for the immediately preceding state exceed some pre-determined number. For example, for X4 programming verification of the S2 state may be skipped until a pre-determined number of memory cells have a Vt above the Vv1 voltage of the S1 state, verification of the S3 state may be skipped until a pre-determined number of memory cells have a Vt above the Vv2 voltage of the S2 state, etc. This smart verify is effective at reducing the total number of verify operations, thereby saving time, power and/or current. Also, this smart verify is effective at avoiding over-programming memory cells, which could happen if verification of a particular start starts at too high of a PV loop. Smart verify may also be performed for X3 programming.

Figure 10:
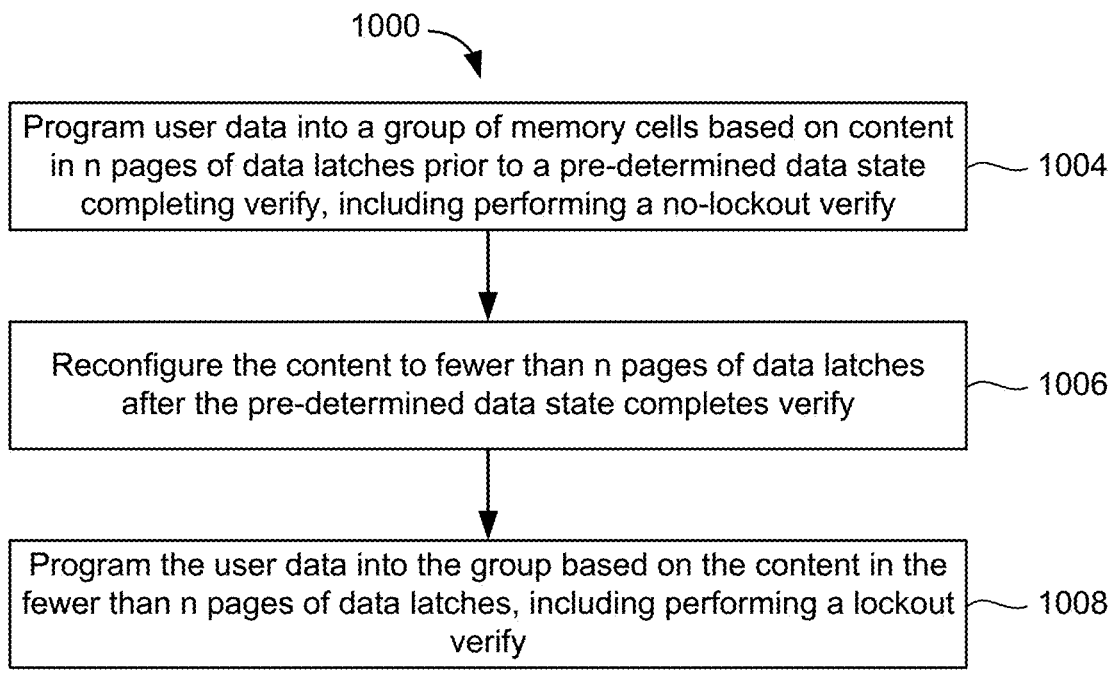
FIG. 10 is a flowchart of one embodiment of a process of programing memory cells in memory structure.

FIG. 10 is a flowchart of one embodiment of a process 1000 of programming memory cells in memory structure 202. The memory structure 202 has bit lines associated with the memory cells. In one embodiment, the process 1000 is used to program NAND memory cells. In one embodiment, process 1000 is used for TLC programming. In one embodiment, the process 1000 uses a three-bit gray code, which may be based on a four-bit gray code. One example of a four-bit code is depicted in FIG. 9A2. The three-bit code has eight of the sixteen states of the four-bit code. For example, in FIG. 9A2 the three-bit code is has states Er, A, B, C, D, E, F, and G (based on S0, S1, S8, S9, S12, S13, S14, and S15 of the four-bit code). Those eight states are based on the state from the four-bit code for which an unused page has a default value. In the example of FIG. 9A2, the unused page is UP. The states that are used are those for which the UP has a value of 1, in that example. In one embodiment, the process 1000 is performed by one or more control circuits (e.g., system control logic 260, column control circuitry 210, row control circuitry 220) of memory die 200. In one embodiment, the process 1000 is performed by one or more control circuits (e.g., system control logic 260, column control circuitry 210, row control circuitry 220) of control die 211. The steps in process 1000 are depicted in a particular order for convenience of description.

Step 1004 includes programming user data into a group of memory cells based on content of n pages of data latches prior to a pre-determined data state completing verify. The group of memory cells could be those in one of the sub-blocks that are connected to a selected word line. The group of memory cells may be referred to herein as a physical page of memory cells. In an embodiment, the physical page has about 16 Kbyte of memory cells. A page of data latches refers to a set of data latches for which there is one data latch for each memory cell in a physical page of memory cells. In an embodiment, the content includes state information. For example, four pages of data latches may contain state information such as in FIG. 9A2. The example of FIG. 9A2 may be considered to have four-bits of state information for each memory cell, factoring in the UP (along with the LP, MP and TP). Note that programming in the X3 mode (i.e., TLC programming) based on the four-bits of state information for each memory cell facilitates use of the circuits that perform QLC programming to also perform TLC programming. For example, the circuitry that performs QLC programming can take actions based on content of the four pages of latches in both the X4 mode and the X3 mode. There will be some differences, however, such using different magnitudes for the verify reference voltages in the X3 mode than the X4 mode.

Step 1004 also includes performing a no-lockout verify. In an embodiment, the pre-determined data state is the A-state. However, the pre-determined data state could be a different state. The no-lockout verify includes charging all of the bit lines associated with the group of memory cells to a sensing voltage. An example of the sensing voltage is about 0.5V. The sense amplifiers may be used to charge the respective bit lines.

Step 1006 includes reconfiguring the content in the n pages of data latches to fewer than n data latches after the pre-determined data state completes verify. For example, the content of four pages of data latches may be reconfigured to three pages of data latches. At the start of programming, four pages of data latches may be used to represent 8 of the 16 states for TLC programming (see, for example, FIG. 9A2). However, recall that the TLC programming may make use of logic circuits that perform QLC programming. Note that if QLC programming were being done then the four pages of data latches may be used to represent the 16 states for QLC programming (see, for example, FIG. 9A1). For both TLC and QLC, four-bits of state information can be stored in a corresponding four data latches per memory cell. Note that in the example of FIGS. 9A1-9A4, after the A-state is done, only the X4 states of S8-S15 remain (because S2-S7 are skipped in the X3 mode). However, for a programming algorithm that is based on the four-bit gray code of, for example, FIG. 9A1, after there are only eight QLC states left to program (e.g., S8-S15), those eight QLC states can be represented in three pages of data latches. For example, the three-bits of state information can be stored in a corresponding three data latches per memory cell. Therefore, in an embodiment, the XDL latches 348 are no longer needed. In an embodiment, the content is reconfigured and stored in the ADL, BDL, and CDL latches. Note that in the example of FIGS. 9A1-9A4 when the A-state is done verifying in the X3 mode, there is no X3 state corresponding to S2-S7. Therefore, in an embodiment, as soon as the A-state has finished verify, the content of the latches can be reduced to the ADL, BDL, and CDL latches. Also note that in the example in FIGS. 9A1-9A4, the B to G states all correspond to one of the S8-S15 states. However, depending on the mapping between the 4-bit gray code and the 3-bit gray code, in some cases, the B-state (or even C, D, etc.) could be mapped to one of the S2 to S7 states, in which case, those states would finish verify prior to reconfiguring the data in step 1006.

Step 1008 includes programming the user data into the group based on the content in the fewer than n pages of data latches after the pre-determined data state completes verify. Step 1108 includes performing a lockout verify. The lockout verify includes charging to the sensing voltage only the bit lines associated with the memory cells that are being verified. Other bit lines may be grounded. In an embodiment, step 1008 includes applying a verify reference voltage associated with a particular state to a selected word line connected to the group of memory cells. The sensing voltage is applied to bit lines associated with memory cells targeted for the particular state while the verify reference voltage is applied to the selected word line. All other bit lines may be grounded while the verify reference voltage is applied to the selected word line. Moreover, note that after a memory cell has already been verified as having been programmed to the particular state it need not be verified again in future PV loops; therefore, such a memory cell may have its bit line locked out (e.g., grounded) in future PV loops even if other memory cells are still being verified for that particular state. If more than one state is verified in a PV loop, a different set of bit lines may then be changed while the next verify reference voltage is applied to the selected word line. Thus, the process saves considerable current and/or power due to charging only those bit lines having a memory cell being verified.

Figure 11:
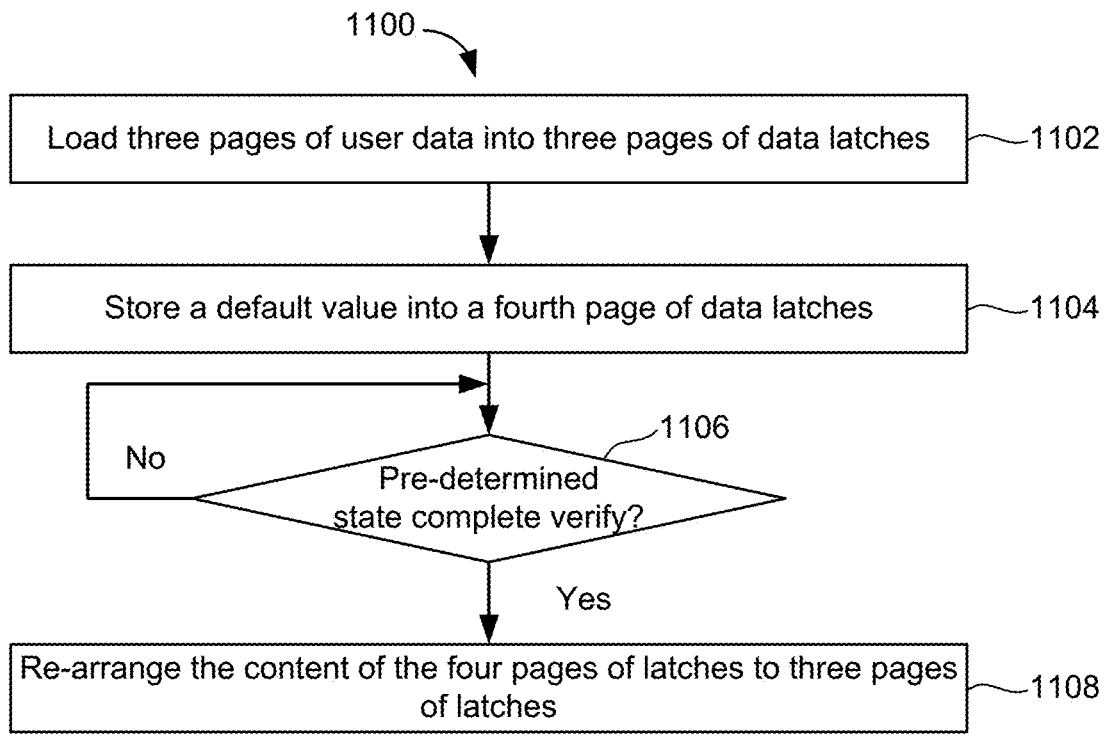
FIG. 11 is a flowchart that depicts further details of one embodiment of a process of data latch usage during an embodiment of programming memory cells.

FIG. 11 is a flowchart that depicts further details of one embodiment of a process 1100 of data latch usage during an embodiment of programming memory cells. The process 1100 can be used during process 1000. Step 1102 includes loading three pages of user data into three pages of data latches associated with a group of memory cells. Step 1104 includes storing a default value into a fourth page of data latches. In one embodiment, the three pages of data latches include two out of three of the ADL, BDL, and CDL latches in the read/write circuits 225. One of the three pages of data latches may be the XDL latches 348 that are external to the read/write circuits 225. In an embodiment, one page of user data is stored in the XDL latches 348 and two pages are stored in two out of three of the ADL, BDL, and CDL latches. The other page of the three pages of the ADL, BDL, and CDL latches may have a default value (either all ones or all zeros) stored therein. For example, as depicted in FIG. 9A2, the LP may be stored in ADL, the MP may be stored in BDL, the TP may be stored in XDL, in accordance with what state (Er, A to G) the memory cell is to be programmed. The UP (all ones) may be stored in CDL.

Step 1106 is a determination of whether a pre-determined state has completed program verify. In one embodiment, the pre-determined state is the highest X3 state that is below S8 in the four-bit gray code. For example, in FIG. 9A2, the A-state is the highest state that is below S8. In some cases, the X3 state could be higher in Vt than the A-state. For example, although the B-state in FIG. 9A2 corresponds to S8, in some mappings the B-state could correspond to an X4 state that is below S8. In such as case, the B-state could be the pre-determined state that triggers step 1108.

Step 1108 includes re-arranging the content in the four pages of data latches to three pages of data latches. For example, the content in ADL, BDL, CDL, and XDL may be re-arranged to ADL, BDL, and CDL. In an embodiment, when the content is in the ADL, BDL, CDL, and XDL latches, four bits of state information are used per memory cell (see FIG. 9A1 or 9A2). However, when the content is in the ADL, BDL, and CDL latches, three bits of state information are used per memory cell. In an embodiment, these three bits of state information correspond to the eight uppermost X4 states, S8-S15 (or the X3 states that correspond to S8-S15). Note that memory cells that have already completed verify could have state information such as the erase state in their data latches in order to inhibit programming of those cells. Thus, it will be appreciated that it is not required that the respective data latches retain the states (e.g., Er, A, B, C, D, E, F, G) throughout the entire programming process.

Figure 12:
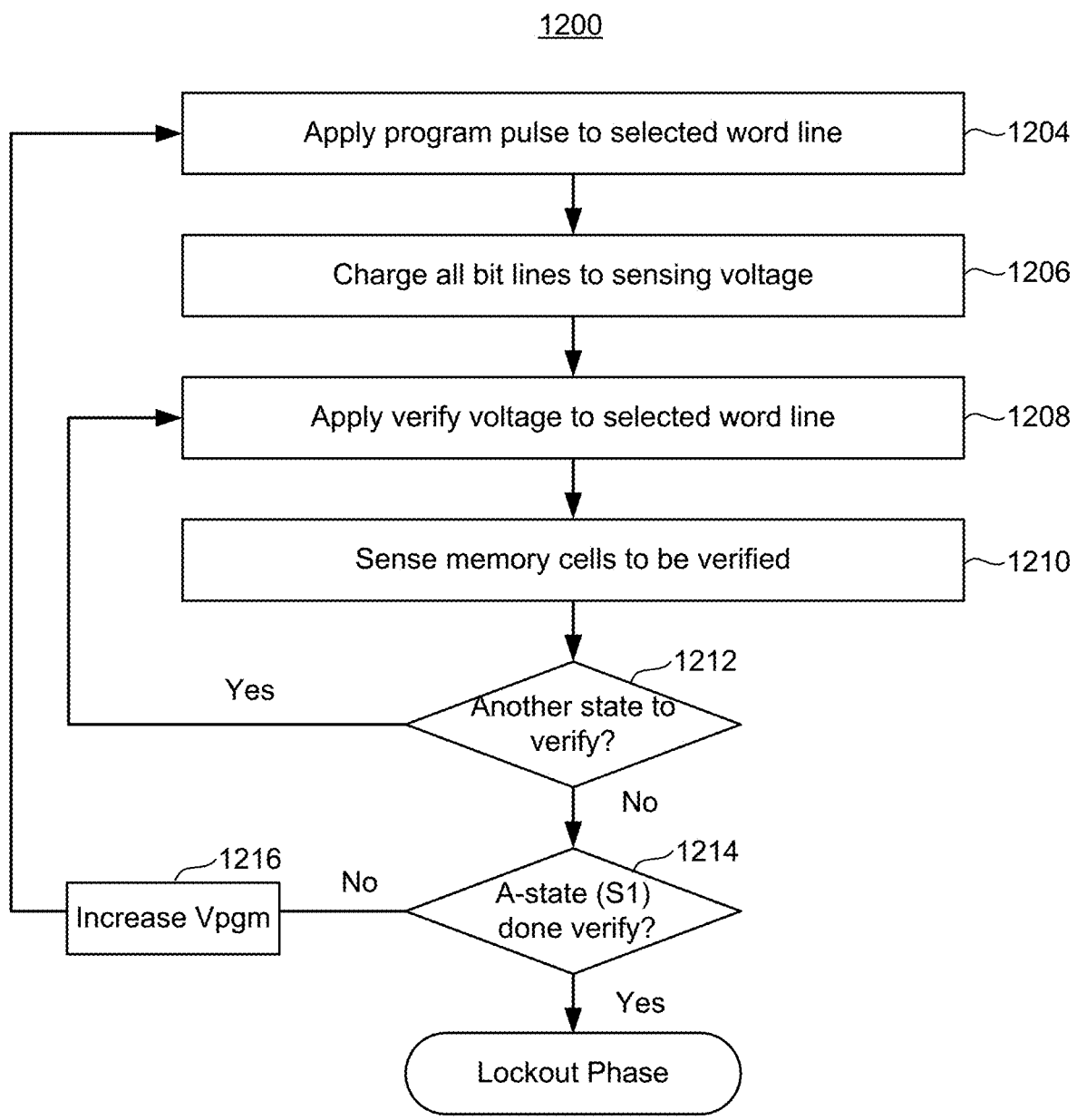
FIG. 12 is a flowchart of one embodiment of a process of programing a group of memory cells in a no-lockout phase.

FIG. 12 is a flowchart of one embodiment of a process 1200 of programming a group of memory cells in a no-lockout phase. The process 1200 may be used in step 1004 of process 1000. The process 1200 is consistent with the gray codes in FIGS. 9A1-9A2, but different gray codes could be used. Step 1204 includes applying a program pulse to the selected word line. Step 1206 includes charging all bit lines associated with the group of cells to a sensing voltage (e.g., 0.5V). Step 1208 includes applying a verify voltage to the selected word line. Step 1210 is to sense the memory cells while the verify voltage is applied to the selected word line. Step 1212 is a determination of whether the is another state to verify this PV loop. If so, the next verify voltage is applied to the selected word line in step 1208 and sensing for the next state is performed in step 1210. After all states that are to be sensed for the PV loop have been verified, then in step 1212 is a determination of whether the A-state has completed verify. If not, the program pulse is incremented in step

1216. Then, the next program pulse is applied to the selected word line in step 1204. Note that steps 1206-1210 are one embodiment of no-lockout verify sensing. After the A-state has been verified, the no-lockout phase of programming is over. Note that step 1214 also indicates that a determination is made whether the S1 state has completed verify. This refers to testing whether the X4 state that corresponds to the A-state has finished. As noted in the example in FIG. 9A1, after S1 there are no more used X4 states (i.e., S2-S7 are skipped states). Next, the lockout phase may be performed.

Figure 13:
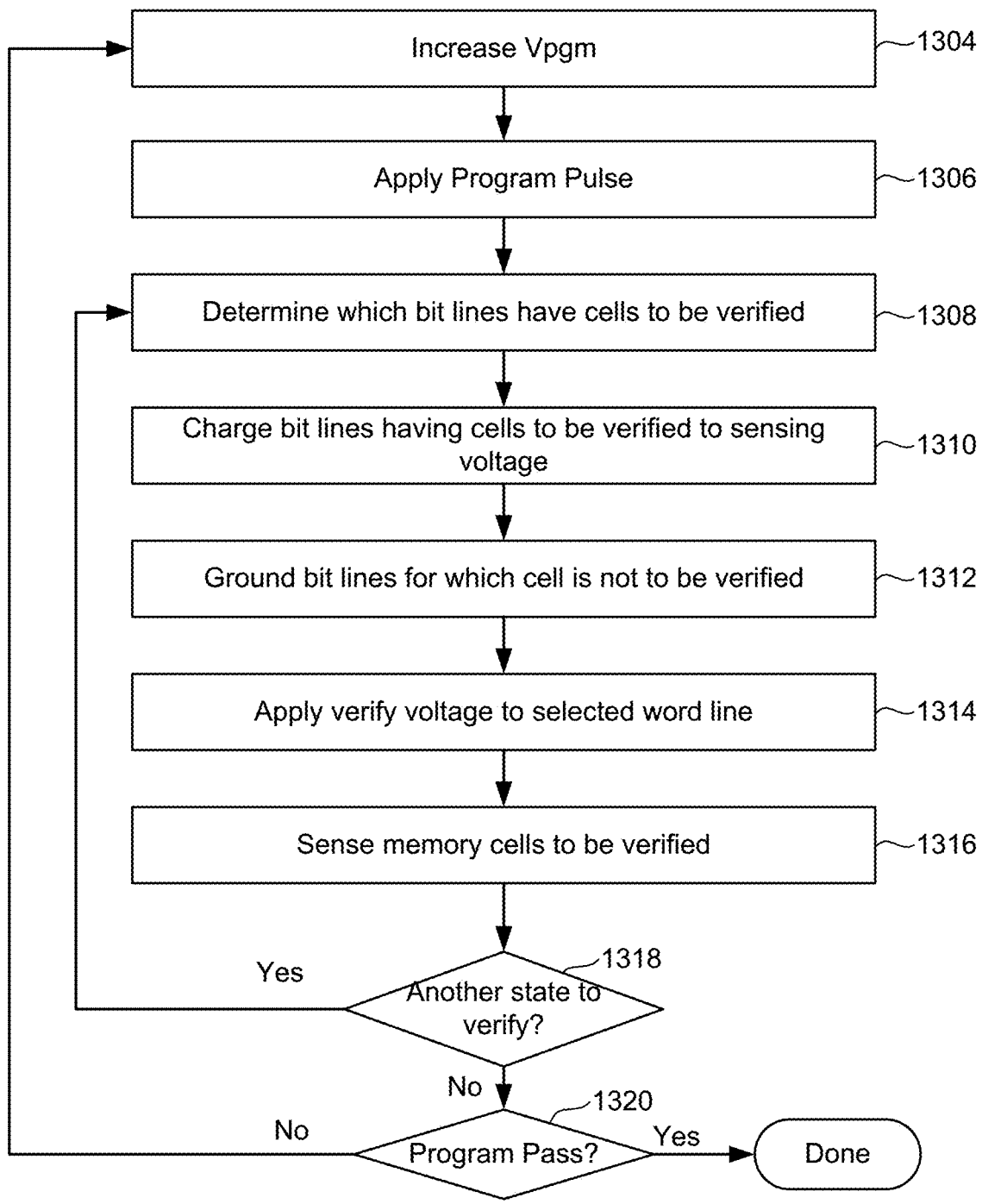
FIG. 13 is a flowchart of one embodiment of a process of programing a group of memory cells in a lockout phase.

FIG. 13 is a flowchart of one embodiment of a process 1300 of programming a group of memory cells in a lockout phase. The process 1300 is one embodiment of step 1008 in process 1000. The latches may be reconfigured as described in, for example, steps 1006 or 1108 prior to performing process 1300.

Step 1304 includes increasing the program voltage (Vpgm). Step 1306 includes applying the next program pulse to the selected word line. Step 1308 includes determining which bit lines have cells to be verified for the next state to be verified. In one embodiment, the ADL, BDL and CDL latches are scanned to determine which memory cells are targeted for programming (and verifying) to a particular state. For example, the particular state may be the B-state. Cells that have already passed verify for the B-state may be excluded as they do not need to be verified any longer. Note that such memory cells will have been inhibited from programming in the most recent iteration of step 1306. In one embodiment, the managing circuit (FIG. 3C, 330) scans the local data latches 340 in read/write circuit 225 in step 1308. Note that the content of the local data latches 340 may be obtained much faster than content in the remote XDL latches 348. For example, the managing circuit 330 may access the remote XDL latches 348 by way of the XDL bus 352, thereby resulting in a much longer access time for content in the XDL latches 348.

Step 1310 includes charging the bit lines having memory cells to be verified to a sensing voltage (e.g., 0.5V). Step 1312 includes grounding bit lines for memory cells that are not to be verified. Step 1314 includes applying a verify voltage to the selected word line. Step 1316 includes sensing memory cells to be verified. Step 1318 is a determination of whether there is another state to verify for this PV loop. If so, steps 1308-1316 are repeated for the next state to be verified. Steps 1308-1316 are one embodiment of lockout verifying sensing.

After all states have been verified for this PV loop (step 1318 is no), then a determination is made whether the programming process has passed in step 1320. If not, then the next PV loop is performed in steps 1304-1318.

Figure 14:
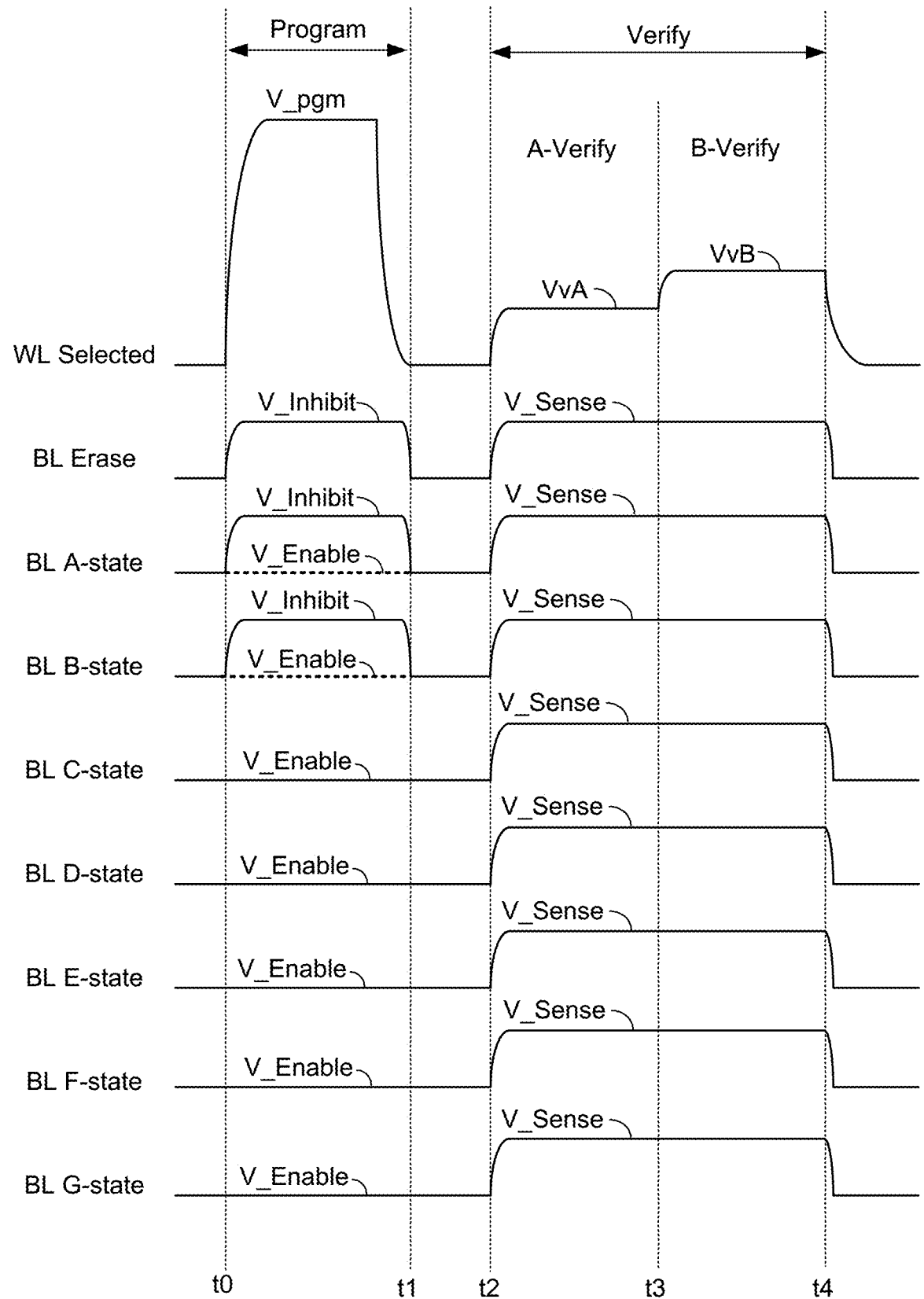
FIG. 14 is a timing diagram of voltages applied to the selected word line and the bit lines during an embodiment of no-lockout verify.

FIG. 14 is a timing diagram of voltages applied to the selected word line and the bit lines during an embodiment of no-lockout verify. The timing diagram is applicable to an embodiment of process 1100. The timing diagram depicts one PV loop, having a program phase followed by a verify phase.

The program voltage (Vpgm) is applied to the selected word line between t0 and t1. The bit line voltages are labeled in accordance with the state to which the memory cell connected to the selected word line is to be programmed. A program enable voltage (V_enable) is applied to bit lines to enable programming of the memory cell connected to the selected word line. A program inhibit voltage (V_inhibit) is applied to bit lines to inhibit programming of the memory cell connected to the selected word line. The program enable voltage may be, for example, 0V. The program inhibit voltage may be, for example, 2.2V. All memory cells to stay in the erase state will have V_inhibit applied to their respective bit lines when the program voltage is applied to the selected word line. The A-state memory cells could either have V_inhibit or V_enable applied to their respective bit lines depending on whether the memory cell has already been verified as having reached VvA. Likewise, the B-state memory cells could either have V_inhibit or V_enable applied to their respective bit lines depending on whether the memory cell has already been verified as having reached VvB. In this example, none of the C-state memory cells have reached VvC, and hence all have V_enable applied to their respective bit lines. In the event a C-state memory cell reaches VvC, it will have V_inhibit applied to its respective bit line for all following PV loops.

After t1 the selected word line voltage is brought down to, for example, 0V. Also, the bit lines that were at V_inhibit are brought down to 0V at t1. Between t2 and t4, all of the bit lines are raised to the sensing voltage (V_Sense), which may be about 0.5V. Between t2 and t3, VvA is applied to the selected word line. Sensing for the A-state takes place between t2 and t3. Between t3 and t4, VvC is applied to the selected word line. Sensing for the C-state takes place between t3 and t4. The no-lockout of FIG. 14 may consume more current than the lockout verify due to all of the bit lines being charged to V_Sense in the verify phase. However, the verify phase is not slowed down by scanning remote XDL latches 348 to determine which bit lines should be charged to V_Sense and which bit lines can be grounded.

Figure 15:
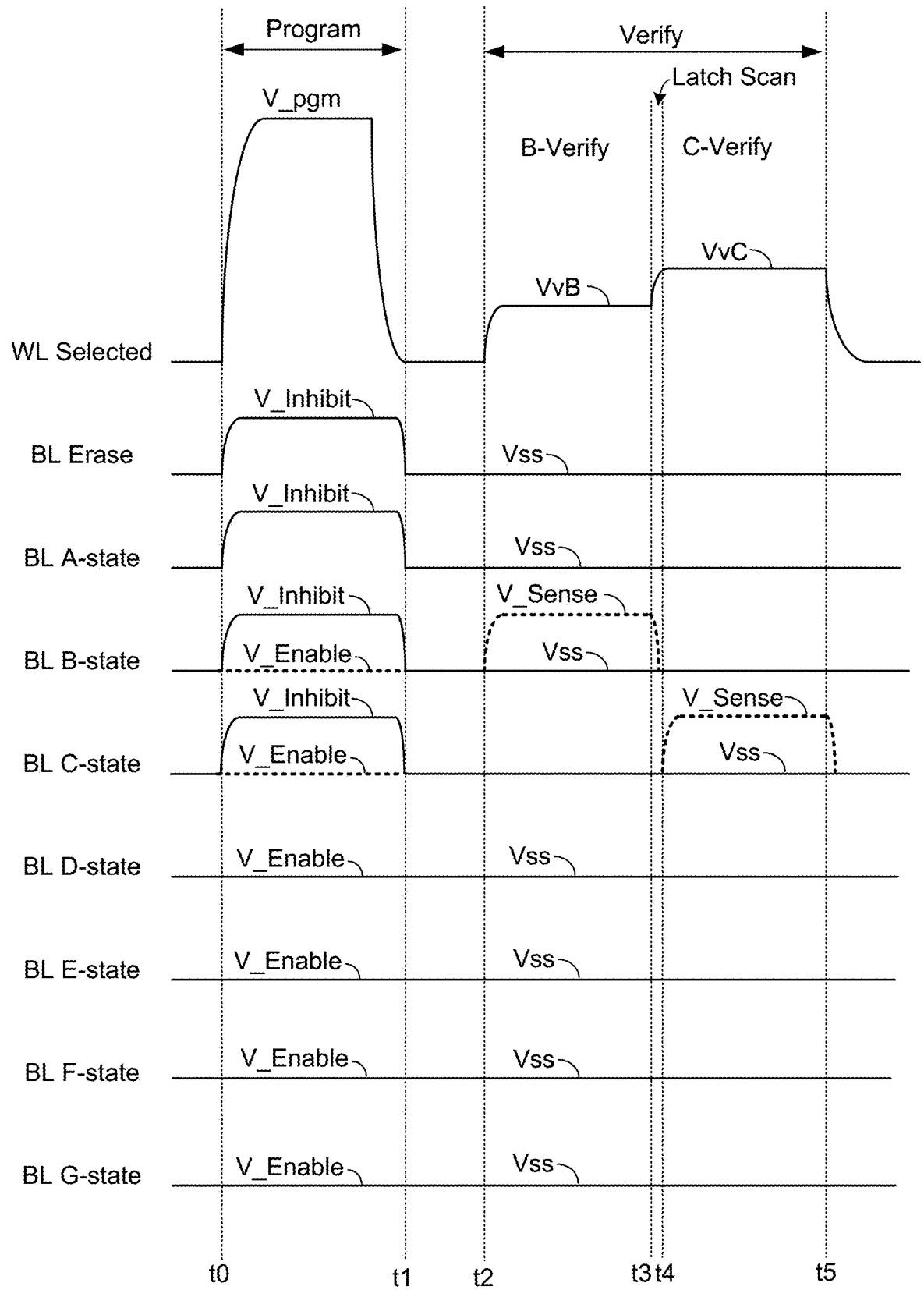
FIG. 15 is a timing diagram of voltages applied to the selected word line and the bit lines during an embodiment of lockout verify.

FIG. 15 is a timing diagram of voltages applied to the selected word line and the bit lines during an embodiment of lockout verify. The timing diagram is applicable to an embodiment of process 1200. The timing diagram depicts one PV loop, having a program phase followed by a verify phase.

The program voltage (Vpgm) is applied to the selected word line between t0 and t1. All memory cells to stay in the erase state will have V_inhibit applied to their respective bit lines when the program voltage is applied to the selected word line. The A-state memory cells also have V_inhibit applied to their respective bit lines because the A-state memory cells have completed verify. However, the B-state memory cells could either have V_inhibit or V_enable applied to their respective bit lines depending on whether the memory cell has already been verified as having reached VvB. In this example, the C-state memory cells could either have V_inhibit or V_enable applied to their respective bit lines depending on whether the memory cell has already been verified as having reached VvC. In this example, none of the D-state memory cells have reached VvD, and hence all have V_enable applied to their respective bit lines. Later in the lockout verify phase, the D, E, F, and G state memory cells may at some point have V_inhibit applied to their respective bit lines.

After t1 the selected word line voltage is brought down to, for example, 0V. Also, the bit lines that were at V_inhibit are brought down to 0V at t1. Between t2 and t3 the selected word line is raised to a B-state verify voltage (VvB). Between t2 and t3 the B-state bit lines that had V_enable applied thereto in the program phase are biased to V_Sense (e.g., 0.5V). However, the B-state bit lines that had V_inhibit applied thereto in the program phase are biased to Vss (e.g., 0V) between t2 and t3. The bit lines for the memory cells targeted for all other states are at Vss between t2 and t3. Therefore, only the B-state bit lines for which memory cells received programming are charged to the sensing voltage between t2 and t3. Sensing for the B-state takes place between t2 and t3. After t3 the bit line voltage for those bit lines that were at V_sense is brought down to, for example, 0V.

Between t3 and t4 the data latches are scanned to determine which bit lines should be charged when verifying the next state. In the present example, the next state is the C-state (note that a similar scan may be performed at some point for the B-state). The data latch scan is very fast as the ADL, BDL, and CDL latches are in the read/write circuits 225. For example, the managing circuit (FIG. 3C, 330) may access the local latches 340 very quickly relative to the more slowly accessible remote XDL latches 348. Between t4 and t5 the selected word line is raised to a C-state verify voltage (VvC). Between t4 and t4 the C-state bit lines that had V_enable applied thereto in the program phase are biased to V_sense (e.g., 0.5V). However, the C-state bit lines that had V_inhibit applied thereto in the program phase are biased to Vss (e.g., 0V) between t4 and t5. The bit lines for the memory cells targeted for all other states are at Vss between t4 and t5. Therefore, only the C-state bit lines for which memory cells received programming are charged to the sensing voltage between t4 and t5. Sensing for the C-state takes place between t4 and t5. After t5, the voltages on the selected word line and the bit lines that were charged to V_sense is brought down to 0V. Therefore, the lockout verify saves considerable current and/or power due to the selective charging of bit lines to V_Sense. Moreover, the fast access to the local latches 340 does not significantly slow the verify phase.

Figure 16:
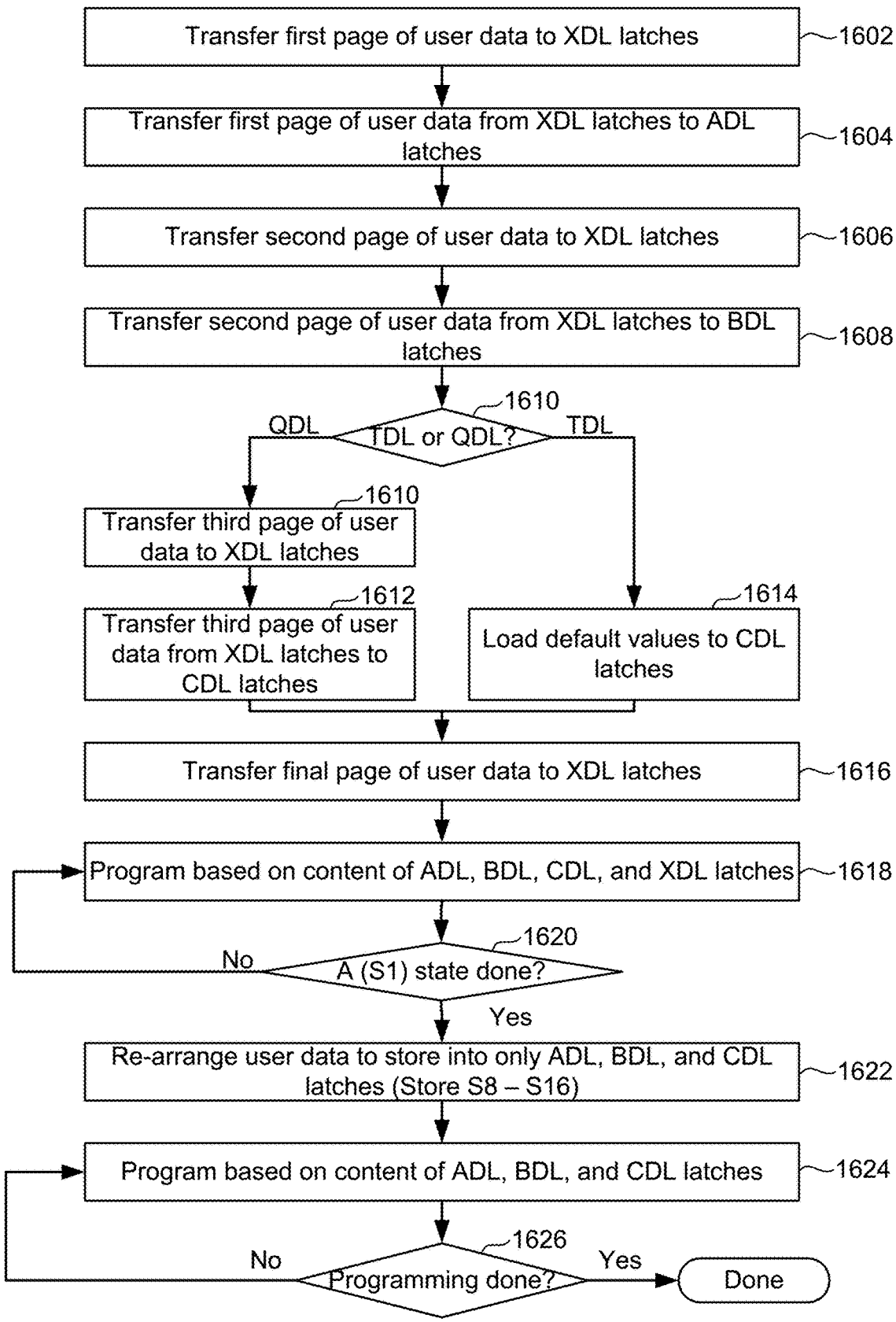
FIG. 16 is a flowchart of one embodiment of a process of data latch usage during programming.

FIG. 16 is a flowchart of one embodiment of a process 1600 of data latch usage during programming. The process 1600 may be used for either X3 or X4 programming. In one embodiment, one set of blocks is used for TLC data and another set of blocks is used for QLC data. Therefore, it is not required that the same group of memory cells be programmed in both the X3 mode and the X4 mode. However, optionally, the same group of memory cells could at different times store TLC data and QLC data. The process 1600 depicts further details of one embodiment of latch usage during any of process 1000, 1110, 1200 or 1300. Process 1600 describes an embodiment that is consistent with the gray codes in FIGS. 9A1-9A4, but may be modified for other gray codes. In one embodiment, the process 1600 is performed by one or more control circuits (e.g., system control logic 260, column control circuitry 210, row control circuitry 220) of memory die 200. In one embodiment, the process 800 is performed by one or more control circuits (e.g., system control logic 260, column control circuitry 210, row control circuitry 220) of control die 211. The steps in process 1600 are depicted in a particular order for convenience of description.

Step 1602 includes transferring a first page of user data to XDL latches 348. The memory controller 120 may transfer the data to the I/O interface 332, which loads the data to the XDL latches 348. Step 1604 includes transferring the first page of data from the XDL latches 348 to the ADL latches in the read/write circuits 225. The data may be transferred over the XDL bus 352.

Step 1606 includes transferring a second page of user data to the XDL latches 348. The memory controller 120 may transfer the data to the I/O interface 332, which loads the data to the XDL latches 348. Step 1608 includes transferring the second page of data from the XDL latches 348 to the BDL latches in the read/write circuits 225. The data may be transferred over the XDL bus 352.

Step 1610 is a conditional depending on whether the process 1600 is being used for X3 (TDL) or X4 (QDL) programming. If the process 1600 is being used for X4 (QDL) programming, then a third page of user data is transferred to the XDL latches 348. The memory controller 120 may transfer the data to the I/O interface 332, which loads the data to the XDL latches 348. Step 1612 includes transferring the third page of data from the XDL latches 348 to the CDL latches in the read/write circuits 225. The data may be transferred over the XDL bus 352.

If the process 1600 is being used for X3 (TDL) programming, then default values are loaded into the CDL latches in step 1614. In one embodiment, the default value is 1 (see, for example, FIG. 9A2). This default value is loaded into each of the CDL latches. However, depending on how the four-bit gray code is mapped to the three-bit gray code, the default value could be 0.

Step 1616 is to transfer a final page of user data to the XDL latches 348. If this is for X3 (TDL), then this is a third page of user data. If this is for X4 (QDL), then this is a fourth page of user data.

Step 1618 includes programming a group of memory cells based on the content of the ADL, BDL, CDL, and XDL latches. In an embodiment, the memory system performs no-lockout verify during step 1618. For example, no-lockout verify as described in process 1200 may be performed. In order to reduce the amount of logic circuitry for programming, at least some of the logic circuitry that is used for X4 programming is also used for X3 programming. In an embodiment, the logic circuits may implement a QLC programming algorithm (gray code and logic) to program 4-bit data in memory cells. In an embodiment, the logic circuits also may implement a TLC programming algorithm (gray code and logic) based on the QLC programming algorithm to program 3-bit data in memory cells.

Step 1620 includes a determination of whether the A-state (for X3) or S1 (for X4) has finished verify. Recall that in the example in FIG. 9A1, after the A-state (corresponding to S1) has finished the next lowest state to verify will be the B-state (corresponding to S8). When this condition is met, then in step 1622 the user data in the latches is re-arranged such that only the ADL, BDL, and CDL latches store the user data. Since there are now only eight of the X4 states to program, the data can be stored in only the ADL, BDL, and CDL latches. For example, the S8-S15 states only include eight states. Hence, the information from the S8-S15 states can be stored in the ADL, BDL, and CDL latches.

Step 1624 includes programming based on the content of the ADL, BDL, and CDL latches. In an embodiment, the system performs lockout verify during step 1624. For example, lockout verify as described in process 1300 may be performed. Step 1626 includes a determination of whether programming is complete. The system continues to perform additional PV loops until programming is complete.

Technology is disclosed herein for a memory system that performs a mixed lockout during program verify. During a first programming phase a no-lockout program verify is performed. After a pre-determined data state has completed verification, during a second programming phase, a lockout program verify is performed. The no-lockout verify may include charging all bit lines associated with the group to a sensing voltage to perform. The lockout verify may include selectively charging to the sensing voltage only bit lines associated with memory cells in the group to be verified to perform the lockout verify. Bit lines associated with memory cells in the group that are not to be verified may be grounded to perform the lockout verify. The lockout verify saves considerable current and/or power relative to the no-lockout verify.

In view of the foregoing, a first embodiment includes an apparatus comprising one or more control circuits configured to connect to a memory structure comprising non-volatile memory cells. The memory structure further comprises bit lines associated with the non-volatile memory cells. The one or more control circuits are configured to program user data into a group of the memory cells based on content in n pages of data latches prior to a pre-determined data state completing verification, including perform a no-lockout program verify. The one or more control circuits are configured re-arrange the content into fewer than n pages of data latches after the pre-determined data state completes verification. The one or more control circuits are configured to program the user data into the group based on the content in the fewer than n pages of data latches after the pre-determined data state completes verification, including perform a lockout verify.

In a second embodiment, in furtherance to the first embodiment, the one or more control circuits are further configured to load three pages of the user data into three pages of then pages of data latches; store a default value into a fourth page of then pages of data latches; re-arrange content in the four pages of the data latches to three pages of data latches after the pre-determined data state complete verification; and determine which bit lines to charge to a sensing voltage during the lockout verify based on content in the three pages of data latches.

In a third embodiment, in furtherance to the first or second embodiments, the three pages of data latches reside in read/write circuits. The fourth page of data latches reside external the read/write circuits.

In a fourth embodiment, in furtherance to any of the first to third embodiments, the user data is represented as a three-bit gray code having eight states. Each of the eight states in the three-bit gray code corresponds to one of sixteen states of a four-bit gray code. The one or more control circuits program the user data based on a programming algorithm for the four-bit gray code, including skipping unused states from the four-bit gray code. The one or more control circuits re-arrange the content into fewer than n pages of data latches after only states corresponding to the eight uppermost states in the four-bit gray code remain to be verified.

In a fifth embodiment, in furtherance the any of the first to fourth embodiments, the one or more control circuits are further configured to charge all bit lines associated with the group to a sensing voltage to perform the no-lockout verify. The one or more control circuits are further configured selectively charge to the sensing voltage only bit lines associated with memory cells in the group to be verified to perform the lockout verify.

In a sixth embodiment, in furtherance the any of the first to fifth embodiments, the one or more control circuits are further configured to ground bit lines associated with memory cells in the group that are not to be verified to perform the lockout verify.

In a seventh embodiment, in furtherance of any of the first to the sixth embodiments, the one or more control circuits are configured to transfer a first page of user data to a page of external data latches that are external to read/write circuits; transfer the first page of the user data from the page of external data latches to a first page of latches internal to the read/write circuits; transfer a second page of user data to the page of external data latches; transfer the second page of the user data from the page of external data latches to a second page of latches internal to the read/write circuits; transfer a third page of user data to the page of external data latches; load a default value into a third page of data latches in the read/write circuits; and the n pages of data latches from which the content is used to program the user data into the group of the memory cells prior to the pre-determined data state completing verification comprise the first page of data latches, the second page of data latches, and the third page of data latches internal to the read/write circuits and the page of external data latches.

In an eighth embodiment, in furtherance to the seventh embodiment, the fewer than n pages of data latches to which the content is re-arranged after the pre-determined data state completes verification include the first page of data latches, the second page of data latches, and the third page of data latches internal to the read/write circuits.

In a ninth embodiment, in furtherance to any of the seventh to the eighth embodiments, the one or more control circuits are configured to scan the content in the first page of data latches, the second page of data latches, and the third page of data latches internal to the read/write circuits to determine which of the bit lines to charge to a sensing voltage during the lockout verify.

One embodiment includes a method for operating non-volatile storage. The method comprises loading three pages of user data and a default page into four pages of data latches, wherein the default page comprises a default value for all bits in the default page. The method comprises verifying programming of the user data into a group of memory cells while charging all bit lines associated with the group while an A-state is still being programmed into the group. The method comprises re-organizing the user data to three pages of data latches after completion of A-state programming. The method comprises verifying programming of the user data into the group after the A-state has completed programming while selectively charging only bit lines associated with memory cells to be verified.

One embodiment includes a non-volatile storage system comprising a memory structure comprising NAND memory cells and bit lines, a plurality of data latches associated with the memory structure, and one or more control circuits in communication with the memory structure and the plurality of data latches. The one or more control circuits are configured to perform a first phase of programming a group of the memory cells based on four-bit state information in four data latches per memory cell of the plurality of data latches and a second phase of programming the group based on three-bit state information in three data latches per memory cell of the plurality of data latches. The one or more control circuits are configured to charge all bit lines associated with the group during verify in the first phase. The one or more control circuits are configured to selectively charge bit lines associated with a subset of the group of memory cells to be verified in the second phase.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
one or more control circuits configured to connect to a memory structure comprising NAND memory cells, wherein the memory structure further comprises bit lines associated with the NAND memory cells, wherein the one or more control circuits are configured to:
load n−1 pages of user data into a first n−1 pages of data latches and a default page into one page of data latches, wherein a total of n pages of data latches are loaded, wherein n is an integer greater than two, wherein n bits of state information are loaded for each memory cell in a group of memory cells, wherein the default page comprises the same bit value for all memory cells in the group;
program the user data into the group of the memory cells based on the n bits of state information in the n pages of data latches prior to a pre-determined data state completing verification, including perform a no-lockout program verify;
re-arrange content in the first n−1 pages of data latches into a second n−1 pages of data latches after the pre-determined data state completes verification, wherein n−1 bits of state information are stored for each memory cell in the group; and
program the user data into the group based on the n−1 bits of state information in the second n−1 pages of data latches after the pre-determined data state completes verification, including perform a lockout verify.

2. The apparatus of claim 1, wherein the one or more control circuits are further configured to:
determine which bit lines to charge to a sensing voltage during the lockout verify based on content in the second n−1 pages of data latches.

3. The apparatus of claim 2, wherein:
the second n−1 pages of data latches reside in read/write circuits; and
the first n−1 pages of data latches include n−2 pages of data latches in the read/write circuits and one page external the read/write circuits.

4. The apparatus of claim 1, wherein:
the user data is represented as a three-bit gray code having eight states, wherein each of the eight states in the three-bit gray code corresponds to one of sixteen states of a four-bit gray code;
the one or more control circuits program the user data based on a programming algorithm for the four-bit gray code, including skipping unused states from the four-bit gray code; and
the one or more control circuits re-arrange the content in the first n−1 pages of data latches into the second n−1 n pages of data latches after only states corresponding to the eight uppermost states in the four-bit gray code remain to be verified.

5. The apparatus of claim 1, wherein the one or more control circuits are further configured to:
charge all bit lines associated with the group to a sensing voltage to perform the no-lockout verify; and
selectively charge to the sensing voltage only bit lines associated with memory cells in the group to be verified to perform the lockout verify.

6. The apparatus of claim 5, wherein the one or more control circuits are further configured to:
ground bit lines associated with memory cells in the group that are not to be verified to perform the lockout verify.

7. The apparatus of claim 1, wherein the one or more control circuits are further configured to:
transfer a first page of user data to a page of external data latches that are external to read/write circuits;
transfer the first page of the user data from the page of external data latches to a first page of latches internal to the read/write circuits;
transfer a second page of user data to the page of external data latches;
transfer the second page of the user data from the page of external data latches to a second page of latches internal to the read/write circuits;
transfer a third page of user data to the page of external data latches;
load a default value into a third page of data latches in the read/write circuits; and
the n pages of data latches from which the content is used to program the user data into the group of the memory cells prior to the pre-determined data state completing verification comprise the first page of data latches, the second page of data latches, and the third page of data latches internal to the read/write circuits and the page of external data latches.

8. The apparatus of claim 7, wherein the second n−1 pages of data latches to which the content is re-arranged after the pre-determined data state completes verification include the first page of data latches, the second page of data latches, and the third page of data latches internal to the read/write circuits.

9. The apparatus of claim 8, wherein the one or more control circuits are further configured to:
scan the content in the first page of data latches, the second page of data latches, and the third page of data latches internal to the read/write circuits to determine which of the bit lines to charge to a sensing voltage during the lockout verify.

10. A method for operating non-volatile storage, the method comprising:
loading three pages of user data and a default page into four pages of data latches, including loading the three pages of the user data into a first three pages of data latches and storing a default value into a fourth page of data latches, wherein the default page comprises the same default value for all bits in the default page;

verifying programming of the user data into a group of NAND memory cells while charging all bit lines associated with the group while an A-state is still being programmed into the group;

re-organizing the user data to a second three pages of data latches after completion of A-state programming, the second three pages of data latches including the fourth page of data latches; and verifying programming of the user data into the group after the A-state has completed programming while selectively charging only bit lines associated with memory cells to be verified based on content in the second three pages of data latches.

11. The method of claim 10, wherein verifying programming of the user data into the group after the A-state has completed programming further comprises:

grounding bit lines associated with memory cells not to be verified based on content in the second three pages of data latches.

12. The method of claim 10, wherein verifying programming of the user data into the group after the A-state has completed programming while selectively charging only bit lines associated with memory cells to be verified further comprises:

scanning the second three pages of data latches to determine which of the bit lines to selectively charge when verifying a particular state after the A-state has completed programming.

13. The method of claim 12, further comprising:

applying a verify reference voltage associated with the particular state to a selected word line connected to the group of memory cells;

applying a sensing voltage to bit lines associated with memory cells targeted for the particular state while the verify reference voltage associated with the particular state is applied to the selected word line; and grounding bit lines associated with memory cells not targeted to the particular state while the verify reference voltage associated with the particular state is applied to the selected word line.

14. A non-volatile storage system comprising:

a memory structure comprising NAND memory cells and bit lines;

a plurality of data latches associated with the memory structure; and one or more control circuits in communication with the memory structure and the plurality of data latches, wherein the one or more control circuits are configured to:

load three pages of user data into a first three data latches per memory cell in a group of memory cells and a default page into one data latch per memory cell, wherein a total of four data latches are loaded per memory cell, wherein four bits of state information are loaded into the four data latches for each memory cell, wherein the default page comprises the same bit value for all memory cells in the group;

perform a first phase of programming the group of the memory cells based on the four-bit state information in the four data latches per memory cell and;

after the first phase, re-arrange content in the first three data latches per memory cell to a second three data latches per memory cell that include the one data latch per memory cell into which the default page was loaded;

perform a second phase of programming the group based on three-bit state information in the second three data latches per memory cell;

charge all bit lines associated with the group during verify in the first phase; and selectively charge bit lines associated with a subset of the group of memory cells to be verified in the second phase.

15. The non-volatile storage system of claim 14, wherein:

the second three data latches per memory cell that store the three-bit state information reside in read/write circuits; and the four data latches per memory cell that store the four-bit state information include the three data latches per memory cell in the read/write circuits and a fourth data latch per memory cell that resides external to the read/write circuits.

16. The non-volatile storage system of claim 15, wherein the one or more control circuits are further configured to:

scan the second three data latches per memory cell during the second phase to determine which of the bit lines to selectively charge.

17. The non-volatile storage system of claim 15, wherein:

the fourth data latch per memory cell is configured to receive user data from a memory controller; and the one or more control circuits are further configured to transfer the user data from the fourth data latch per cell to one of the second three data latches per cell in the read/write circuit.

18. The non-volatile storage system of claim 14, wherein the group of the memory cells is a first group, wherein the one or more control circuits are configured to:

program a second group of the memory cells in the memory structure using a four-bit gray code having sixteen states and four pages, including storing the four-bit state information in the four data latches per memory cell; and perform the first phase and the second phase of programming the first group of the memory cells based on a three-bit gray code, including storing the four-bit state information in the four data latches per memory cell, wherein the three-bit gray code includes eight states of the sixteen states of the four-bit gray code for which an unused page of the four-bit gray code comprises a default value.

19. The non-volatile storage system of claim 18, wherein the one or more control circuits are further configured to:

change the four-bit state information in the four data latches per memory cell in the first phase of programming the first group to the three-bit state information in the three data latches per memory cell in the second phase of programming the first group in response to states in the three-bit gray code that correspond to S1-S7 in the four-bit gray code completing verify.

20. The non-volatile storage system of claim 14, wherein:

the memory structure resides on a first semiconductor die; and the plurality of data latches and the one or more control circuits reside on a second semiconductor die that is affixed to the first semiconductor die.

* * * * *